US006882051B2

(12) United States Patent
Majumdar et al.

(10) Patent No.: US 6,882,051 B2
(45) Date of Patent: Apr. 19, 2005

(54) NANOWIRES, NANOSTRUCTURES AND DEVICES FABRICATED THEREFROM

(75) Inventors: Arun Majumdar, Orinda, CA (US); Ali Shakouri, Santa Cruz, CA (US); Timothy D. Sands, Moraga, CA (US); Peidong Yang, Berkeley, CA (US); Samuel S. Mao, Berkeley, CA (US); Richard E. Russo, Walnut Creek, CA (US); Henning Feick, Kensington, CA (US); Eicke R. Weber, Oakland, CA (US); Hannes Kind, Schaffhausen (CH); Michael Huang, Los Angeles, CA (US); Haoquan Yan, Albany, CA (US); Yiying Wu, Albany, CA (US); Rong Fan, El Cerrito, CA (US)

(73) Assignee: The Regents of the University of California, Oakland, CA (US)

( * ) Notice: Subject to any disclaimer, the term of this patent is extended or adjusted under 35 U.S.C. 154(b) by 10 days.

(21) Appl. No.: 10/112,578

(22) Filed: Mar. 29, 2002

(65) Prior Publication Data

US 2002/0175408 A1 Nov. 28, 2002

Related U.S. Application Data

(60) Provisional application No. 60/280,676, filed on Mar. 30, 2001, and provisional application No. 60/349,206, filed on Jan. 15, 2002.

(51) Int. Cl.[7] ............................................... H01L 23/48
(52) U.S. Cl. ........................ 257/746; 257/741; 257/734
(58) Field of Search .............................. 257/734, 741, 257/746, 749

(56) References Cited

U.S. PATENT DOCUMENTS 3,493,431 A   2/1970   Wagner
3,580,732 A   5/1971   Blakeslee et al.
3,632,405 A   1/1972   Knippenberg et al.

(Continued)

FOREIGN PATENT DOCUMENTS

| EP | 0 548 905 | 12/1992 |
|----|-----------|---------|
| EP | 0 838 865 | 10/1997 |
| EP | 0 544 408 | 1/2000  |
| EP | 1 100 106 | 10/2000 |

OTHER PUBLICATIONS

Zhang, Y. et al.; "Coaxial Nanocable: Silicon Carbide and Silicon Oxide Sheathed with Boron Nitride and Carbon," Science, vol. 281, pp. 973–975, Aug. 14, 1998.

Hiruma, K. et al., "Self–organized growth of GaAs/InAs heterostructure nanocylinders by organometallic vapor phase epitaxy", Journal of Crystal Growth, North–Holland Publishing Co., Amsterdam. NL, vol. 163, No. 3, Jun. 1, 1996 (Jun. 01, 1996), pp. 226–231, XP000627505 ISSN: 0022–0248.

(Continued)

*Primary Examiner*—Michael S. Lebentritt
*Assistant Examiner*—Brad Smith
(74) *Attorney, Agent, or Firm*—John P. O'Banion

(57) ABSTRACT

One-dimensional nanostructures having uniform diameters of less than approximately 200 nm. These inventive nanostructures, which we refer to as "nanowires", include single-crystalline homostructures as well as heterostructures of at least two single-crystalline materials having different chemical compositions. Because single-crystalline materials are used to form the heterostructure, the resultant heterostructure will be single-crystalline as well. The nanowire heterostructures are generally based on a semiconducting wire wherein the doping and composition are controlled in either the longitudinal or radial directions, or in both directions, to yield a wire that comprises different materials. Examples of resulting nanowire heterostructures include a longitudinal heterostructure nanowire (LOHN) and a coaxial heterostructure nanowire (COHN).

21 Claims, 22 Drawing Sheets

U.S. PATENT DOCUMENTS

| | | | |
|---|---|---|---|
| 4,099,986 | A | 7/1978 | Diepers |
| 5,260,957 | A | 11/1993 | Hakimi et al. |
| 5,332,910 | A | 7/1994 | Haraguchi et al. |
| 5,702,822 | A | 12/1997 | Terui et al. |
| 5,858,862 | A | 1/1999 | Westwater et al. |
| 6,225,198 | B1 | 5/2001 | Alivisatos et al. |
| 6,248,674 | B1 | 6/2001 | Kamins et al. |
| 6,306,736 | B1 | 10/2001 | Alivisatos et al. |
| 2002/0130311 | A1 * | 9/2002 | Lieber et al. ................... 257/1 |

OTHER PUBLICATIONS

Kanjanachuchai, S. et al., "Coulomb blockaded in strained–Si nanowires on leaky virtual substrates", Semiconductor Science and Technology, vol. 16, No. 2, Feb. 2001 (Feb. 2001), pp. 72–76, XP002209467, London UK.

Haraguchi, K., et al., "Polarization dependence of light emitted from GaAs p–n junctions in quantum wire crystals", Journal of Applied Physics, American Institute of Physics, New York, US, vol. 75, No. 8, Apr. 15, 1994 (Apr. 15, 1996), pp. 4220–4225, XP000447894 ISSN: 0021–8979.

Givargizov, E. et al., "Fundamental Aspects of VLS Growth", Journal of Crystal Growth, North–Holland Publishing Co., Amsterdam, NL, No. 31, 1975, pp. 20–30, XP001073851 ISSN: 0022–0248.

Gaul, David A, et al.; "True Blue Inorganic Optoelectronic Devices," Advanced Materials, vol. 12, No. 13, p. 935–946, Jul. 5, 2000.

Haase, M.A. et al.; "Blue–Green Laser Diodes," Applied Physics Letters, vol. 59, No. 11, pp. 1272–1274, Sep. 9, 1991.

Nakamura, Shuji et al.; "InGaN–Based Multi–Quantum–Well–Structure Laser Diodes," Japanese Journal of Applied Physics, vol. 35, pp. L74–L75, Jan. 15, 1996.

Cao, H. et al.; "Spatial Confinement of Laser Light in Active Random Media," Physical Review Letters, vol. 84, No. 24, pp. 5584–5587, Jun. 12, 2000.

Bagnall, D.M. et al.; "Optically Pumped Lasing of ZnO at Room Temperature," Applied Physics Letters, vol. 70, No. 17, pp. 2230–2232, Apr. 28, 1997.

Yu, P. et al.; "Room–Temperature Gain Spectra and Lasing in Microcrystalline ZnO Thin Films," Journal of Crystal Growth, vol. 184/185, pp. 601–604, (1998).

Klingshirn, C.; "Properties of the Electron–Hole Plasma in II–VI Semiconductors," Journal of Crystal Growth, vol. 117, pp. 753–757, (1992).

Kayanuma, Yosuke; "Quantum–Size Effects of Interacting Electrons and Holes in Semiconductor Microcrystals with Spherical Shape," Physical Review B, vol. 38, No. 14, pp. 9797–9805, Nov. 15, 1988.

Wegscheider, W. et al.; "Lasing from Excitons in Quantum Wires," Physical Reveiw Letters, vol. 71, No. 24, p. 4071–4074, plus photo page, Dec. 13, 1993.

Haraguchi, Keiichi et al.; "GaAs p–n Junction Formed in Quantum Wire Crystals," Applied Physics Letters, vol. 60, No. 6, pp. 745–747, Feb. 10, 1992.

Duan, Xiangfeng et al.; "Indium Phosphide Nanowires as Building Blocks for Nanoscale Electronic and Optoelectronic Devices," Nature, vol. 409, pp. 66–69, Jan. 4, 2001.

Klimov, V.I. et al.; "Optical Gain and Stimulated Emission in Nanocrystal Quantum Dots," Science, vol. 290, pp. 314–317, Oct. 13, 2000.

Pavesi, L. et al.; "Optical Gain in Silicon Nanocrystals," Nature, vol. 408, pp. 440–444, Nov. 23, 2000.

Huang, Michael H. et al.; "Catalytic Growth of Zinc Oxide Nanowires by Vapor Transport," Advanced Materials, vol. 13, pp. 113–116, (2001).

Fons, P. et al.; "Uniaxial Locked Epitaxy of ZnO on the a Face of Sapphire," Applied Physics Letters, vol. 77, No. 12, pp. 1801–1803, Sep. 18, 2000.

Wagner, R. S. and Ellis, W.C.; "Vapor–Liquid–Solid Mechanism of Single Crystal Growth," Applied Physics Letters, vol. 4, No. 5, pp. 89–90, Mar. 1, 1964.

Givargizov, E.I.; "Fundamental Aspects of VLS Growth," Journal of Crystal Growth, vol. 31, pp. 20–30, (1975).

Bradshaw, Steven M. and Spicer, John L.; "Combustion Synthesis of Aluminum Nitride Particles and Whiskers," Journal of American Ceramic Society, vol. 82, No. 9, pp. 2293–2300, (1999).

Hu, Jiangtao et al.; "Chemistry and Physics in One Dimension: Synthesis and Properties of Nanowires And Nanotubes," Accounts of Chemical Research, vol. 32, pp. 435–445, (1999).

Wagner, R.S.; "VLS Mechanism of Crystal Growth," in Whisker Technology, edited by A.P. Levitt, pp. 47 thru 119, Wiley–Interscience, New York, (1970).

Hiruma, Kenji et al.; "GaAs Free–Standing Quantum–Size Wires," Journal of Applied Physics, vol. 74, No. 5, pp. 3162–3171, Sep. 1, 1993.

Haraguchi, K. et al.; "Self–Organized Fabrication of Planar GaAs Nanowhisker Arrays," Applied Physics Letters, vol. 69, No. 3, pp. 386–387, Jul. 15, 1996.

Hiruma, Kenji et al.; "Self–Organized Growth of GaAs/InAs Heterostruicture Nanocylinders by Organometallic Vapor Phase Epitaxy," Journal of Crystal Growth, vol. 163, pp. 226–231, (1996).

Haraguchi, K. et al.; "Polarization Dependence of Light Emitted From GaAs p–n Junctions in Quantum Wire Crystals," Journal of Applied Physics, vol. 75, No. 8, pp. 4220–4225, Apr. 15, 1994.

Yazawa, Masamitsu et al.; "Semiconductor Nanowhiskers," Advanced Materials, vol. 5, No. 7/8, pp. 577–580, (1993).

Hu, Jiangtao et al.; "Chemistry and Physics in One Dimension: Synthesis and Properties of Nanowires and Nanotubes," Accounts of Chemical Research, vol. 32, No. 5, pp. 435–445, (1999).

Wong, Eric W. et al.; "Nanobeam Mechanics: Elasticity, Strength, and Toughness of Nanorods and Nanotubes," Science, vol. 277, pp. 1971–1975, Sep. 26, 1997.

Canham, L.T.; "Silicon Quantum Wire Array Fabrication by Electrochemical and Chemical Dissolution of Waters," Applied Physics Letters, vol. 57, No. 10, pp. 1046–1048, Sep. 3, 1990.

Holmes, Justin D. et al.; "Control of Thickness and Orientation of Solution–Growth Silicon Nanowires," Science, vol. 287, pp. 1471–1473, Feb. 25, 2000, Hicks, L.D. and Dresselhaus, M.S.; "Thermoelectric Figure of Merit of a One–Dimensional Conductor," vol. 47, No. 24, pp. 16–631 thru 16–634, Jun. 15, 1993–II.

Cui, Yi and Lieber, Charles M.; "Functional Nanoscale Electronic Devices Assembled Using Silicon Nanowire Building Blocks," Science, vol. 291, pp. 851–853, Feb. 2, 2001.

Huang, Michael H. et al.; "Room–Temperature Ultraviolet Nanowire Nanolasers," Science, vol. 292, pp. 1897–1899, Jun. 8, 2001.

Favier, Frederic et al.; "Hydrogen Sensors and Switches from Electrodeposited Palladium Mesowire Arrays," Science, vol. 293, pp. 2227–2231, Sep. 21, 2001.

Kovtyukhova, Nina I. et al.; "Layer–By–Layer Assembly of Rectifying Junctions in and on Metal Nanowires," Journal Physical Chemistry B, vol. 105, No. 37, p. 8762–8769, (2001).

Hu, Jiangtao et al.; "Controlled Growth and Electrical Properties of Heterojunctions of Carbon Nanotubes and Silicon Nanowires," Nature, vol. 399, pp. 48–51, May 6, 1999.

Zhang, Y. et al.; "Heterostructures of Single–Walled Carbon Nanotubes and Carbide Nanorods," Science, vol. 285, pp. 1719–1722, Sep. 10, 1999.

Zhou, Chongwu et al.; "Modulated Chemical Doping of Individual Carbon Nanotubes," Science, vol. 290, pp. 1552–1555, Nov. 24, 2000.

Markowitz, Paul D. et al.; "Phase Separation in Alx Ga1–x As Nanowhiskers Grown by the Solution–Liquid–Solid Mechanism," Journal of American Chemical Society, vol. 123, pp. 4502–4511, (2001).

Nicewarner–Pena, Sheila R. et al.; "Submicrometer Metallic Barcodes," Science, vol. 294, pp. 137–141, Oct. 5, 2001.

Wu, Yiying and Yang, Peidong; "Direct Observation of Vapor–Liquid–Solid Nanowire Growth," Journal of American Chemical Society, vol. 123, pp. 3165–3166, (2001).

Koga, T. et al.; "Carrier Pocket Engineering Applied to 'Strained' Si/Ge Superlattices to Design Useful Thermoelectric Materials," Applied Phyics Letters, vol. 75, No. 16, pp. 2438–2440, Oct. 18, 1999.

Koga, T. et al.; "Experimental Proof–of–Principle Investigation of Enhanced Z3DT in Oriented Si/gE Superlattices," Applied Physics Letters, vol. 77, No. 10, pp. 1490–1492, Sep. 4, 2000.

Venkatasubramanlan, Rama et al.; "Thin–Film Thermoelectric Devices with High Room–Temperature Figures of Merit," Nature, vol. 413, pp. 597–602, Oct. 11, 2001.

Wu, Yiying et al.; "Block–By–Block Growth of Single–Crystalline Si/SiGe Superlattice Nanowires," Submitted to Nano Letters, no known publication date, pp. 1 thru 4, 2002.

* cited by examiner

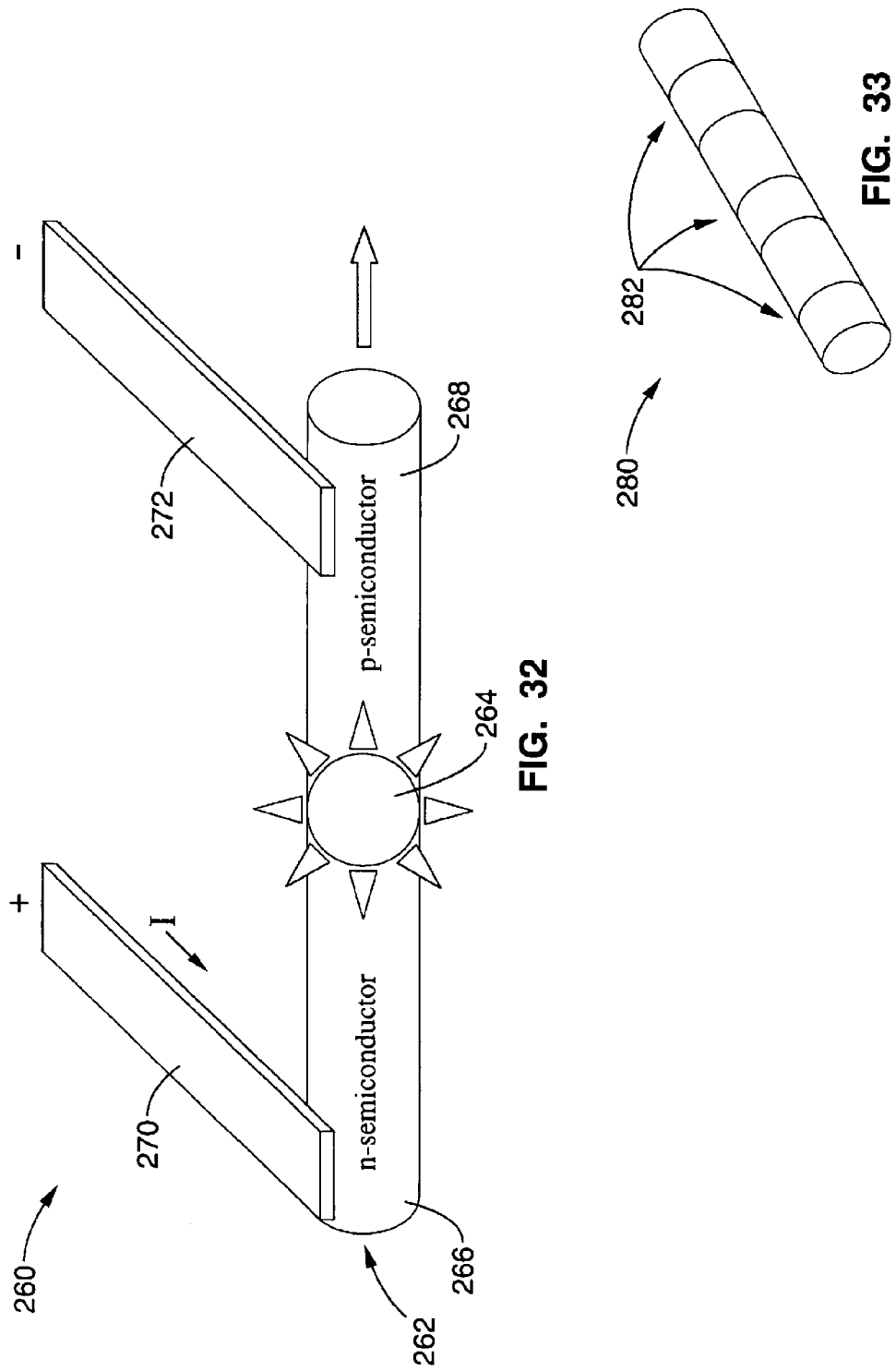

NANOWIRES, NANOSTRUCTURES AND DEVICES FABRICATED THEREFROM

CROSS-REFERENCE TO RELATED APPLICATIONS

This application claims priority from U.S. provisional application Ser. No. 60/280,676 filed on Mar. 30, 2001, incorporated herein by reference, and from U.S. provisional application Ser. No. 60/349,206 filed on Jan. 15, 2002, incorporated herein by reference.

STATEMENT REGARDING FEDERALLY SPONSORED RESEARCH OR DEVELOPMENT

This invention was made with Government support under Contract No. DE-AC03-76SF00098, awarded by the Department of Energy, Grant No. DMR-0092086, awarded by the National Science Foundation, and Grant No. CTS-0103609, awarded by the National Science Foundation. The Government has certain rights in this invention.

REFERENCE TO A COMPUTER PROGRAM APPENDIX

Not Applicable

BACKGROUND OF THE INVENTION

1. Field of the Invention

The present invention pertains generally to nanostructures, and more particularly to a substantially crystalline nanowire structure having a diameter along the wire axis which varies by less than approximately 10% over a section exhibiting the maximum change in diameter, and which has a diameter of less than approximately 200 nm. The nanowire structure can be formed as a homostructure, as a heterostructure, and as combinations thereof.

2. Description of the Background Art

The ability to efficiently convert energy between different forms (e.g., thermal, electrical, mechanical, and optical) as illustrated in FIG. 1 creates the infrastructure of any modern economy and is one of the most recognizable symbols of advances in science and engineering. Optoelectronics, for example, deals with the conversion between optical and electronic forms, which has laid the foundation for many aspects of modern information technology. Conversion between thermal energy and electrical power is the hallmark of the energy economy, where even marginal improvements in efficiency and conversion methods can have enormous impact on both monetary savings, energy reserves, and the environment. Similarly, electromechanical energy conversion lies at the heart of many modern machines and sensors, which have found widespread use in technology. Given its importance, it is natural to ask whether nanoscale science and engineering can play any role in energy conversion. Clearly, in view of the continuing quest for miniaturization and increased efficiency of devices, nanoscale devices can play a role in energy conversion. Accordingly, there is a need for a broad spectrum of high performance energy conversion devices based on one-dimensional inorganic nanostructures or nanowires. The present invention satisfies that need, as well as others, and overcomes deficiencies inherent in conventional devices.

BRIEF SUMMARY OF THE INVENTION

The present invention pertains generally to nanostructures which are substantially crystalline, and more particularly to one-dimensional nanostructures having a diameter along the longitudinal axis which does not vary by more than approximately 10% over the section exhibiting the maximum change in diameter, and having a diameter of less than approximately 200 nm at the point of maximum diameter. These inventive nanostructures, which we refer to as "nanowires", preferably comprise substantially monocrystalline homostructures, as well as heterostructures of at least one substantially crystalline material and one other material where an interface or junction is formed therebetween. Heterostructures according to the present invention can also include combinations of homostructures and heterostructures. In the event that substantially crystalline materials are used to form the heterostructure, the resultant heterostructure will be substantially crystalline as well. Additionally, nanowires according to the invention can have various cross-sectional shapes, including, but not limited to, circular, square, rectangular and hexagonal.

Heterostructures can be formed with any number of segments, both longitudinally and coaxially, where adjacent segments are substantially crystalline or where a substantially crystalline segment is adjacent to a material which is not substantially crystalline. Many of the nanowire heterostructures according to the present invention are generally based on a semiconducting wire wherein the doping and composition are controlled in either the longitudinal or radial directions, or in both directions, to yield a wire that comprises different materials. Segments of heterostructures can be various materials, including, for example, semiconductor materials which are doped or intrinsic and arranged to form a variety of semiconductor devices with junctions such as pn, pnp, npn, pin, pip and so forth.

By way of further example, according to an aspect of the invention, the nanowire could comprise different materials when viewed longitudinally, such as would be the case with alternating or periodic segments of different materials or multi-segmented nanowires where at least two of the segments comprise different materials. We refer to this configuration as a longitudinal heterostructure nanowire (LOHN). An example would be a LOHN where adjacent segments have different chemical compositions such as Si and SiGe.

According to another aspect of the invention, the nanowire would be a coaxial-type structure, comprising a core of a first material surrounded by a jacket of a second material. We refer to this configuration as a coaxial heterostructure nanowire (COHN).

The junctions between the compositionally substantially crystalline materials defining nanowire heterostructures according to the present invention typically exhibit a high degree of sharpness. For example, in accordance with the present invention, the interface between these materials can be made as sharp as approximately one atomic layer to approximately 20 nm. However, since heterostructures according to the present invention can comprise multiple segments either longitudinally, coaxially, or both, it is also possible to form heterostructures where some junctions exhibit a high degree of sharpness and others do not depending upon the particular application and need. Furthermore, not only can the composition of the materials forming adjacent segments be sharp or gradual, but by controlling the doping of materials forming segments of the heterostructure, it is possible to have sharp or gradual dopant transition between segments.

In certain embodiments of the present invention, the nanostructures of this invention expressly exclude structures comprising carbon nanotubes and/or structures comprising what are commonly referred to as "whiskers" or "nanowhiskers".

It will be appreciated that various configurations can be achieved using the foregoing inventive structures, some of which have been previously described. By way of further example, and not of limitation, these configurations can include single and multiple junction LOHNs, single and multiple junction COHNs, combinations of LOHN and COHN structures, two-terminal configurations, N>2 terminal configurations, combinations of heterostructures and homostructures, homostructures with one or more electrodes (which would also be an overall heterostructure), heterostructures with one or more electrodes, homostructures with insulators, heterostructures with insulators, and the like. It will also be appreciated that the interface between a nanowire and a terminal constitutes a heterojunction. A variety of devices can be fabricated using these structures and configurations, including, but not limited to, phonon bandgap devices, quantum dots that confine electrons in specific areas, thermoelectric devices (e.g., solid state refrigerators and engines), photonic devices (e.g., nanolasers), nanoelectromechanical (MEM) devices (electromechanical actuators and sensors), energy conversion devices of various forms including for example, light to mechanical energy or thermal energy to light, and other devices.

According to another aspect of the invention, a process for fabricating nanowires has been developed. In particular, this aspect of the invention includes a process for making a population of nanowire heterostructures with a substantially monodisperse distribution of diameters. A population of nanowires is considered to have a substantially monodisperse distribution of diameters if the distribution of diameters within the population is less than or equal to approximately 50% rms, more preferably less than or equal to 20% rms, and most preferably less than 10% rms. A further aspect of the invention comprises a process for forming populations of nanowires with a substantially monodisperse distribution of lengths. A population of nanowires is considered to have a monodisperse distribution of lengths in the distribution of lengths within the population is less than or equal to 20% rms, more preferably less than or equal to 10% rms, more preferably less than or equal to 5% rms, and most preferably less than 1%. A further aspect of the invention comprises a design for nanowires that permits batch fabrication in large quantities. Another aspect of the invention includes a laser device that can be formed from either a heterostructure or a homogeneous structure.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only:

FIG. 32 is a schematic view of an nanowire-based electron ejection light emitting diode/laser diode according to the present invention.

FIG. 33 is a schematic perspective view of a longitudinal heterostructure nanowire (LOHN) with quantum dots according to the invention.

DETAILED DESCRIPTION OF THE INVENTION

Figure 1:
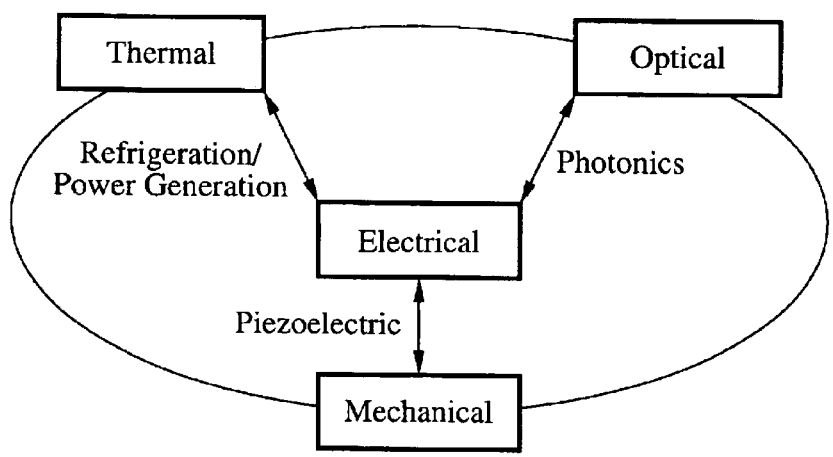
FIG. 1 is diagram illustrating conversion between different forms of energy that are enabled by 1-D semiconducting and dielectric nanowires according to the present invention.

1. Introduction.

The present invention comprises a family of nanostructures which we refer to as "nanowires". Nanowires in accordance with the present invention generally comprise heterostructures of at least one substantially crystalline material and one other compositionally different material where an interface or junction is formed therebetween. However, nanowire heterostructures according to the invention can also include heterostructures where the materials are the same but have different crystalline orientations. Furthermore, the surface of a nanowire according to the present invention (whether a homostructure or a heterostructure) could be functionalized to capture specific chemical or biological species. In the event that substantially crystalline materials are used to form the heterostructure, it will be appreciated that the resultant heterostructure will be substantially crystalline as well. Preferably at least one of the materials in the heterostructure is substantially monocrystalline. In this regard, we refer to a material as being substantially crystalline if the material exhibits long range ordering.

A nanowire according to the present invention preferably has a diameter of less than approximately 200 nm at its maximum point, and the diameter along the longitudinal axis preferably varies by less than approximately 10% over the section exhibiting the maximum change in diameter. Additionally, nanowires according to the invention can have various cross-sectional shapes, including, but not limited to, circular, square, rectangular and hexagonal. For example, ZnO nanowires have a hexagonal cross-section, $SnO_2$ nanowires have a rectangular cross-section, PbSe nanowires have a square cross-section, and Si or Ge nanowires have a circular cross-section. In each case, the term "diameter" is intended to refer to the effective diameter, as defined by the average of the major and minor axis of the cross-section of the structure.

It should be appreciated that the nanowire materials of the present invention are fundamentally different from those commonly referred to as semiconductor "whiskers" formed by using basic VLS growth techniques. It is well understood that the mechanism responsible for the growth of these "whiskers" is limited to the creation of semiconductor wires of a diameter greater than approximately 1 $\mu$m.

The methods of the present invention describe a method of modifying VLS growth in which the catalyst size is arrested to form nanowires with diameters from approximately 1 nm to approximately 200 nm. Due to the quantum confinement effects, these structures are fundamentally different than whiskers, which are larger than the Bohr exciton radius of the bulk semiconductors from which they are formed, and therefore represent a unique composition of matter. The physical, optical, and electronic properties of these materials are fundamentally different than would be achieved if the characteristics of whiskers were simply extrapolated toward far smaller sizes. In the nanowire size range these materials represent a new form of matter, different than bulk material in ways which are unique and non-obvious. The importance of the distinction between nanowires and traditional "whiskers" should be appreciated. Whiskers operate as small "bulk" semiconductor wires and thereby provide the same functionality as wires formed by standard photolithographic semiconductor processing techniques. The nanowires described within the present invention, however, display both electronic and optical properties that are fundamentally different than the bulk material from which they are formed, and are characteristically different than that of "whiskers".

Nanowire heterostructures according to the present invention include configurations where two or more substantially monocrystalline materials are spatially arranged in such a manner that quantum confinement effects are exploited in new and unique ways. This approach is expected to not only open the road to scientific discoveries, but also offer the promising prospects of dramatically changing energy conversion technology.

In certain embodiments of the invention fabrication is facilitated with the well known vapor-liquid-solid (VLS) chemical synthesis process which will be described herein. The basic (unmodified) VLS process is also described in detail in the following publications which are incorporated herein by reference: Wagner, R. S., "VLS Mechanism of Crystal Growth", Whisker Technology, pp. 47–119 (1970); Wagner et al., "Vapor-Liquid-Solid Mechanism of Single Crystal Growth", Applied Physics Letters, Vol. 4., No. 5, pp. 89–90 (1964); and Givargizov, E., "Fundamental Aspects of VLS Growth", Journal of Crystal Growth, Vol. 31, pp. 20–30 (1975). Using the basic (unmodified) VLS, it is possible to grow monocrystalline nanowires of a wide variety of semiconducting materials (e.g., Si, Ge, ZnO, etc.) with an average diameter greater than approximately 1 $\mu$m and a diameter distribution greater than 50% and lengths up to or exceeding many millimeters. The present invention provides methods of forming nanowires structures with a diameter less than approximately 200 nm and preferably in the range of approximately 5 nm to approximately 50 nm, with lengths in the range of approximately 100 nm to approximately 100 $\mu$m, preferably in the range between approximately 1 $\mu$m to approximately 20 $\mu$m.

Furthermore, if the diameter of semiconducting nanowires is reduced to the range of approximately 5 nm to approximately 50 nm, quantum confinement of electrons and holes allows tailoring of the electronic band structure of the entire nanowire or of one or more domains within the nanowire. Such confinement can also strongly influence photon and/or phonon transport in nanowires because both the photon and/or phonon spectra and lifetimes can be significantly modified. The importance of surface energy and growth anisotropy in nanowire synthesis also affords the possibility of synthesizing phases that are stable in nanowire form but metastable in the bulk or as thin films. Hence, materials with unique phases and properties can be created in this manner.

2. Nanowire Heterostructures.

Figure 2:
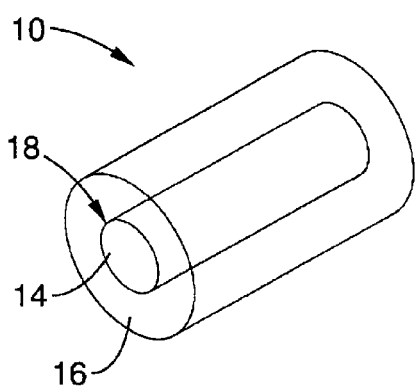
FIG. 2 is a schematic perspective view of a coaxial heterostructure nanowire (COHN) according to the present invention having a sheath over a homostructure core.
Figure 3:
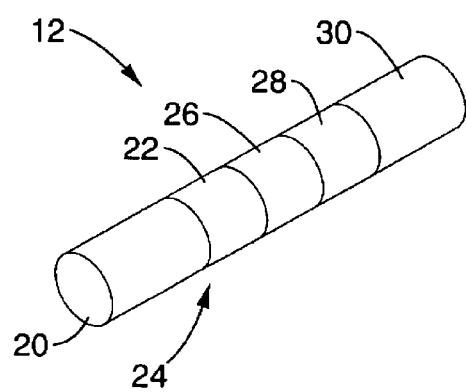
FIG. 3 is a schematic perspective view of a longitudinal heterostructure nanowire (LOHN) according to the present invention having five segments (e.g., superlattice).

Referring now to FIG. 2 and FIG. 3, an aspect of the present invention comprises the following two nanowire heterostructures as building blocks for other heterostructures and devices: (i) a coaxial heterostructure nanowire (COHN) 10; and (ii) a longitudinal heterostructure nanowire (LOHN) 12. In the example shown in FIG. 2, COHN 10 comprises a substantially crystalline core 14 surrounded by a sheath 16 of a compositionally different material where a junction 18 is formed therebetween. Sheath 16 can be substantially crystalline or amorphous, a polymer, semiconductor, oxide or the like. In the example shown in FIG. 3, LOHN 12 comprises at least one segment 20 of a substantially crystalline material adjacent to at least one other segment 22 of a compositionally different material where a junction 24 is formed therebetween.

Heterostructures according to the present invention can be formed with any number of segments, both longitudinally and coaxially, and in various configurations, some of which are described below.

For example, FIG. 3 shows a superlattice of additional segments 26, 28, and 30, thereby illustrating that a heterostructure is not limited to only two adjacent segments. It will be appreciated, however, that at least two of the segments should comprise compositionally different materials in order to be a heterostructure. By "compositionally different" we mean (i) the materials have different chemical compositions (whether intrinsic or doped) or (ii) the materials have different crystal directions (e.g., the same materials but different crystal orientation). The nanowire heterostructure could comprise compositionally different materials when viewed longitudinally, such as would be the case with alternating or periodic segments of different materials or multi-segmented nanowires where at least two of the segments comprise different materials. An example of a LOHN where adjacent segments have different compositions would be a segment of Si adjacent to a segment SiGe.

Figure 4:
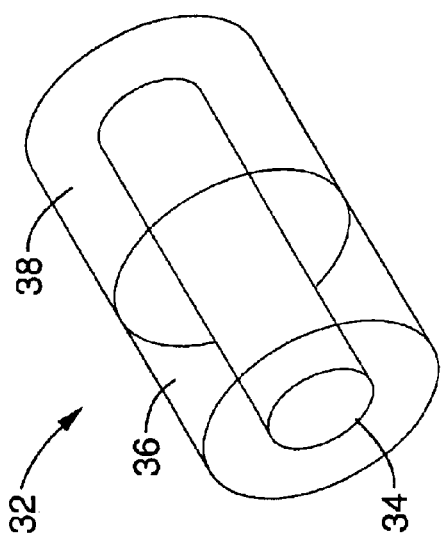
FIG. 4 is a schematic perspective view of a coaxial heterostructure (COHN) according to the present invention having a segmented sheath over a homostructure core.
Figure 6:
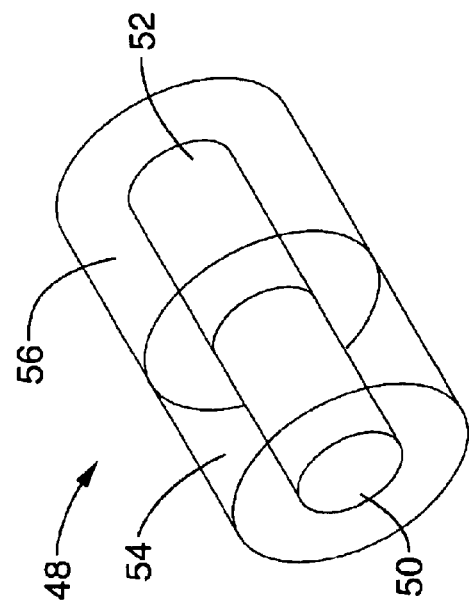
FIG. 6 is a schematic perspective view of a coaxial heterostructure (COHN) according to the present invention having a segmented core (e.g., LOHN) and a segmented sheath.
Figure 5:
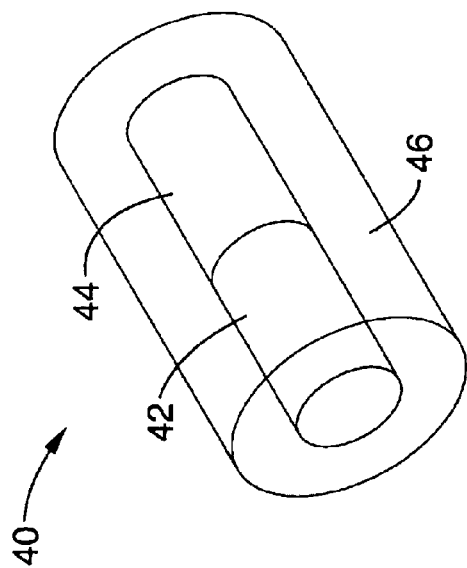
FIG. 5 is a schematic perspective view of a coaxial heterostructure (COHN) according to the present invention having a segmented core (e.g., LOHN).
Figure 7:
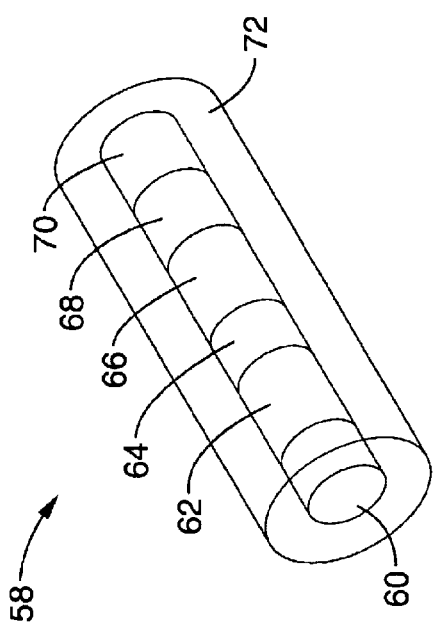
FIG. 7 is a schematic perspective view of a coaxial heterostructure (COHN) according to the present invention having a superlattice core (e.g., LOHN).

FIG. 4 through FIG. 7 illustrate various examples of COHNs having additional segments. For example, FIG. 4 shows a COHN 32 having a core 34 and a sheath comprising first and second segments 36, 38, respectively. FIG. 5 shows a COHN 40 having a core comprising first and second segments 42, 44, respectively, surrounded by a sheath 46. FIG. 6 shows a COHN 48 having a core comprising first and second core segments 50, 52, respectively, and a sheath comprising first and second sheath segments 54, 56, respectively. FIG. 7 illustrates a COHN 58 having a core comprising a superlattice of segments 60, 62, 64, 66, 68, 70 surrounded by a sheath 72. Note that the sheath can be crystalline or amorphous, and can include materials such as polymers, semiconductors, oxides, and the like. In addition, COHNs can have multiple sheath layers.

Figure 9:
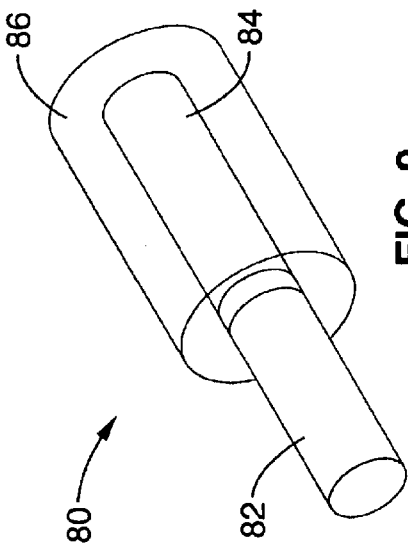
FIG. 9 is a schematic perspective view of a coaxial heterostructure (COHN) according to the present invention having a partial sheath over a segmented core (e.g., LOHN).
Figure 8:
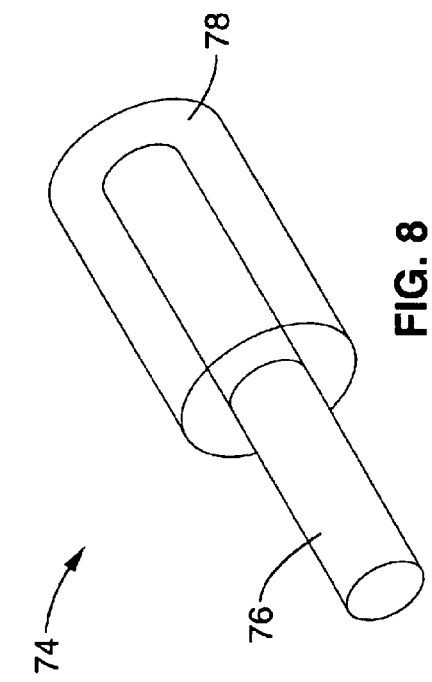
FIG. 8 is a schematic perspective view of a coaxial heterostructure (COHN) according to the present invention having a partial sheath on a homostructure core (e.g., LOHN).

In certain embodiments, COHNs can be formed by partially coating a single-segment nanowire or a LOHN. For example, FIG. 8 shows a COHN 74 having a single-segment core 76 which is only partially surrounded by a sheath 78. FIG. 9 shows a COHN 80 having a LOHN core comprising segments 82, 84 wherein the core is only partially surrounded by sheath 86. Alternatively, the cores could comprise superlattices with a partial sheath. Note also that the sheath portion could be segmented as well and, further, that the segments of the sheath could be adjacent or spaced-apart. Those skilled in the art will appreciate that these sheath configurations are achieved using conventional masking techniques, and that these configurations represent just a few of the possible configurations based on the nanowire structures described herein.

From the foregoing, it will be appreciated that segments of heterostructures can comprise various materials, including, for example, semiconductor materials which are doped or undoped (i.e. pure intrinsic semiconductors) and arranged to form a variety of semiconductor devices with junctions such as pn, pnp, npn, pin, pip and so forth. In certain embodiments the materials can be doped in a conventional manner. For example, conventional dopants such as B, Ph, As, In and Al can be used. Both the nanowire and the dopant materials can be selected from Groups II, III, IV, V, VI, etc. and can include quaternaries and tertiaries, as well as oxides.

One of the inventive aspects of the present invention is that while it is commonly believed that such nanostructures cannot be "homogeneously doped" (i.e. doped such that dopant molecules are dispersed in a microscopically homogeneous manner), the materials of the present invention operate as if homogeneous doping was performed, because they conduct as would be expected if dopant molecules had been homogeneously distributed throughout the material. This result is unexpected since the high temperature and small size of the nanowires would suggest that all dopant molecules would be annealed to the surface of the wires, where they would behave in the manner of trap sites rather than replicating the electronic properties of a "homogeneously doped" semiconductor.

In a number of embodiments, the present invention contemplates nanowire heterostructures comprising one or more doped semiconductors selected from a group that includes, but is not limited to, type II–VI semiconductor, type III–V semiconductor, type II–IV semiconductor, and the like.

Figure 11:
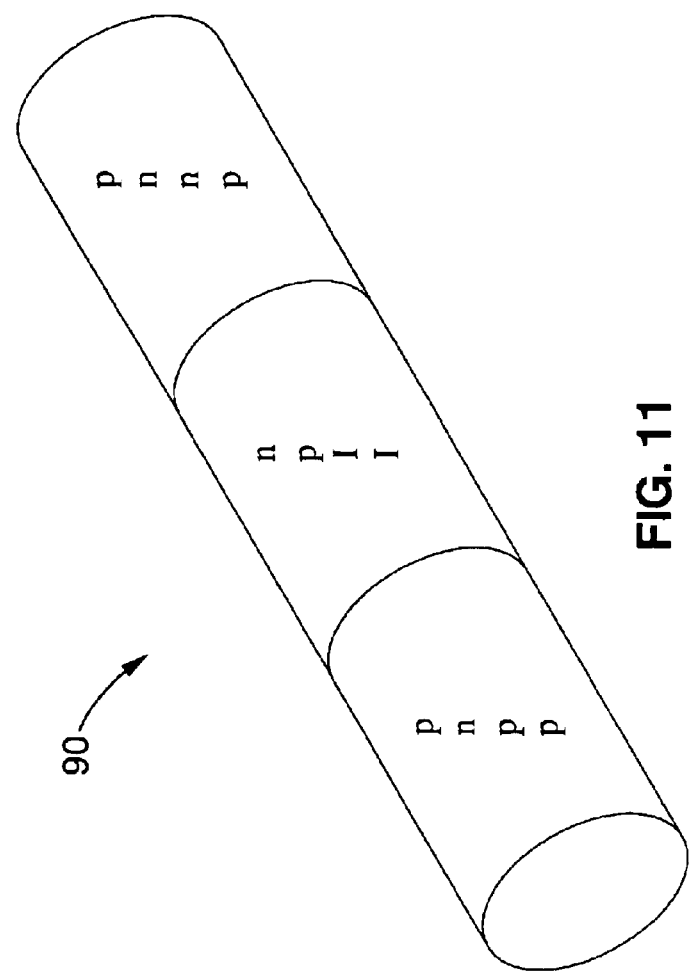
FIG. 11 is a schematic perspective view of a pnp, npn, pin, pip heterojunction according the present invention.
Figure 10:
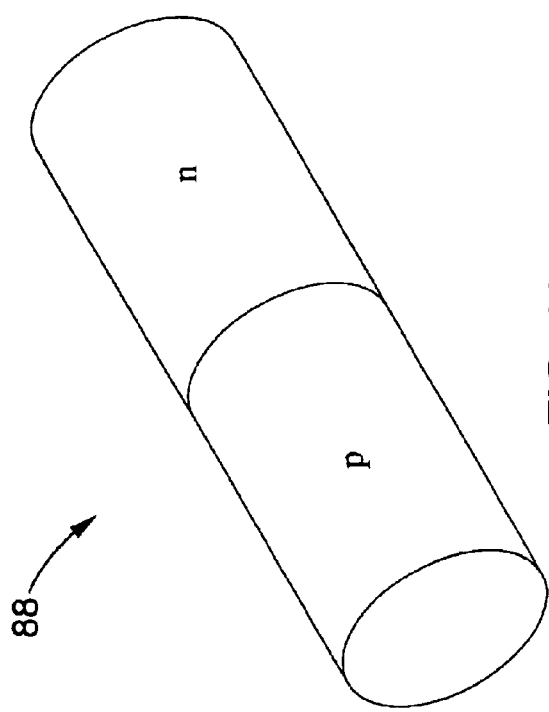
FIG. 10 is a schematic perspective view of a pn heterojunction according to the present invention.

Essentially any semiconductor material and its alloys can be used as adjacent materials in a nanowire heterostructure according to the present invention. For example, FIG. 10 schematically illustrates a nanowire heterostructure 88 which is a pn junction device 88. FIG. 11 schematically illustrates a nanowire heterostructure 90 which is a pnp, npn, pin, pip, etc. junction device. Many of the nanowire heterostructures according to the present invention are generally based on a semiconducting wire wherein the doping and composition are controlled in either the longitudinal or radial directions, or in both directions, to yield a wire that comprises compositionally different materials.

As indicated above, in a heterostructure according to the present invention at least one of the segments comprises a material that is substantially crystalline, particularly at its core. It will be appreciated that oxides on a nanowire surface can be amorphous without destroying the substantially crystalline ordering of the nanowire core. In addition, the nanocrystals can include defects, substitutions of atoms, certain dislocations, and combinations thereof, without defeating substantial long-range ordering. In general, insofar as the material exhibits substantial long-range ordering (e.g. ordering over a distance of approximately 100 nm, it will be regarded as substantially crystalline and/or substantially monocrystalline. Insofar as the material exhibits long-range ordering, then the material is considered to be substantially crystalline according to the present invention. Preferably, at least the inner 20% of the material from the cross-sectional center outward is substantially monocrystalline. In the case of silicon nanowires, epitaxial growth is preferred (i.e., monocrystalline growth for silicon on a silicon wafer by precipitating silicon from a vapor).

The diameter of a nanowire according to the present invention is typically less than approximately 200 nm at the maximum point of diameter and preferably in the range from approximately 5 nm to approximately 50 nm. In addition, the variation in diameter across an ensemble of wires synthesized in the same process is relatively sharp, such that the distribution of diameters is typically less than approximately 50%, preferably less than approximately 20%, more preferably less than approximately 10%. In cases where the cross-section of the nanowire is not circular, the term "diameter" in this context refers to the average of the lengths of the major and minor axis of the cross-section of the nanowire, with the plane being normal to the longitudinal axis of the nanowire.

In certain embodiments, nanowires according to the present invention typically exhibit a high uniformity in diameter from end to end. More particularly, over a section of the nanowire that shows the maximum change in diameter would preferably not exceed approximately 10%, more preferably it would not exceed approximately 5%, and most preferably it would not exceed approximately 5%. The change in diameter may be considered to be given by $(d_{max}-d_{min})/d_{min}$. It should be recognized by one of ordinary skill in the art that the ends of the nanowire will contain a sharp change in diameter, possibly even exhibiting an infinite slope, wherein the measure described above is considered to be at a location away from the ends of the nanowires. The measurement preferably being made at a location separated from an end by at least 5%, and more preferably at least 10%, of the total length of the wire. In certain embodiments, the change in diameter is evaluated over a length of the nanowire that ranges from approximately 1%, preferably up to approximately 25%, more preferably up to approximately 75%, and most preferably up to approximately 90% of the total length of the nanowire.

The junctions between the compositionally different substantially crystalline materials defining nanowire heterostructures according to the present invention typically exhibit a high degree of sharpness. For example, in accordance with the present invention, the transition zone between these materials can be made as sharp as approximately one atomic layer to the total lateral length of the nanowire (i.e. a continuously varying alloy along the length of the wire). Typically, the transition should be relatively sharp, however, the transition may span between a single atomic layer and approximately 50 nm, and more preferably between a single atomic layer and approximately 20 nm.

For the purposes of evaluating the length of a transition (transition zone) in the case of a LOHN, the beginning of the transition zone transitioning from a first material to a second material can be defined as a point along the longitudinal axis moving from the first material to the second material wherein the deviation in material composition (e.g. dopant concentration and/or base material composition) of the first material is less than approximately 20%, more preferably less than approximately 10%, more preferably less than approximately 5%, and most preferably less than approximately 1%. The end of the transition zone transitioning from the first material to the second material can be defined as the point along the longitudinal axis moving from the first material to the second material where the deviation in material composition of the nanowire at that point as compared to the composition (e.g. dopant concentration and/or base material concentration) of the second material is less than approximately 20%, more preferably less than approximately 10%, more preferably less than approximately 5%, and most preferably less than approximately 1%. In the case of a COHN, the beginning and end of the transition zone are measured as a function of composition radially from the center of the nanowire. In either case, the transition zone should represent a change from a substantially crystalline and preferably substantially monocrystalline material to a compositionally different material. It should be appreciated, however, that since heterostructures according to the present invention can comprise multiple segments either longitudinally, coaxially, or both. It should also be appreciated that it is also possible to form heterostructures in which some junctions exhibit a high degree of sharpness while others do not, as depends upon the specific application and requirements. Furthermore, not only can the composition of the materials forming adjacent segments be sharp or gradual, but by controlling the doping of materials forming segments of the heterostructure, it is possible to have sharp or gradual dopant transitions between segments.

Referring again to FIG. 2, note that the band structure of materials 14 and 16 in COHNs can be so chosen that one can achieve modulation doping, whereby the dopant atoms would reside in the sheath 16 and the carriers would be generally confined in the core 14. This will provide very high electron mobility due to reduced dopant and interface scattering that has been observed in uncoated nanowires. This is the one-dimensional (1-D) version of the two-dimensional (2-D) electron gas that is created by semiconductor 2-D heterostructures. Such a 1-D electron gas can then utilized, for example, in high-performance thermoelectric and photonic devices where electron mobility plays an important role.

3. Nanowire Synthesis.

Nanostructures with reduced dimensionality such as nanowires are both fundamentally interesting and technologically important. Yet, nanowire synthesis has remained an enormous challenge for material scientists because of the difficulty with one-dimensional control. Carbon nanotubes can also be used as templates to prepare nanorods of different compositions. There are also efforts using membrane templates to make metal or semiconducting nanorods. However, these nanorods are mostly polycrystalline, which partly limit their potential usefulness. In order to gain well-defined structure-property correlation for these 1D systems, it was necessary to develop general and predictive methodology for the synthesis of single crystalline nanowires with uniform size and aspect ratio.

3.1 VLS Mechanism.

The nanowires and nanowire heterostructures of the present invention can be synthesized by a wide variety of methods. In preferred embodiments, however, the nanowires are synthesized utilizing a modified vapor liquid solid (VLS) procedure. This process is described in detail in the examples provided herein, which are provided by way of example and not of limitation, wherein a number of modifications of the exemplified process are contemplated and within the scope of the present invention.

In contrast to the above synthetic approaches, the vapor-liquid-solid (VLS) process is a very powerful method to chemically synthesize single-crystalline 1D nanomaterials. This process, which has been previously used to produce micron sized whiskers and recently nanowires with various compositions, involves dissolving the gas reactants in nano-sized catalytic liquid followed by one-dimensional growth of single-crystalline nanowhiskers. The catalyst can be easily chosen based on the analysis of the equilibrium phase diagrams.

EXAMPLE 1

Figure 12:
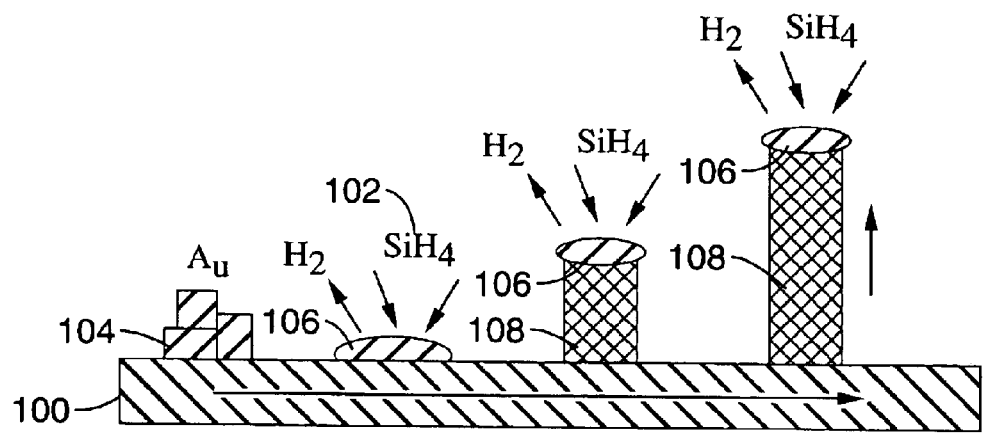
FIG. 12 is a schematic process flow diagram illustrating vapor-liquid-solid (VLS) type growth of a 1-dimensional Si nanowire according to the present invention using Au nanoclusters as catalysts and $SiH_4$ as the vapor source.

Referring to the schematic diagram in FIG. 12, an example of the growth process of an Si nanowire on an Si (111) substrate 100 is illustrated. In this example, $SiH_4$ gas 102 is utilized as the Si vapor source and Au nanoclusters 104 as catalysts. The chemical vapor deposition (CVD) is preferably carried out at approximately 600° C. to approximately 800° C. At this temperature, the Au nanoclusters 104 form a liquid alloy with Si and spontaneously break up into nanometer sized droplets 106 of Au—Si alloy. Next, the Si species continuously deposit into Au—Si alloy droplets where growth of the Si nanowire 108 is initiated upon supersaturation of the gold by the silicon. The process continues until nanowire 108 achieves the desired length. Nanowires have been successfully prepared from Si, Ge and ZnO utilizing this mechanism in a conventional chemical vapor transport/deposition (CVT/CVD) system. Transmission electron microscopy (TEM) and X-ray diffraction (XRD) studies indicate that the inorganic nanowires are single crystalline with a preferred growth direction (e.g. [111] for Ge). The diameter of these nanowires can be precisely controlled at diameters less than approximately 200 nm. Preferably the diameters are controlled at diameters less than approximately 100 nm, more preferably less than approximately 50 nm, and most preferably less than approximately 25 nm, 15 nm, or 10 nm. By using catalyst nanoclusters (e.g. Au, Co, Ni, Fe) with a monodisperse diameter distribution and with different sizes (e.g. from approximately 1 nm to approximately 100 nm, more typically from approximately 5 nm to approximately 100 nm), such nanowires can readily be produced (e.g. having a diameter ranging from approximately 5 nm to approximately 200 nm, and most typically from approximately 10 nm to approximately 50 nm). These catalysts can be either dispersed on a Si substrate (e.g. an Si substrate or a substrate comprising other desired material or materials) or on top of a mesoporous silica film (e.g. an Si film or alternative films comprising other desired material or materials). It was also found that the aspect ratio of the nanowires can be varied from approximately 1.5 or 2 to on the order of 1,000,000 and more typically from appromximately 100 to approximately 100,000 by using different growth times.

The position of the nanowires on substrate 100 can be controlled through any convenient method of patterning the catalyst. Such methods include, but are not limited to various sputtering and controlled deposition techniques, various lithographic masking and/or etching techniques, along with additional methods and combinations thereof. In certain embodiments, nanowire arrays can be fabricated by lithographically patterning a thin film catalyst on the substrate and heating the film until it melts into a plurality of droplets where each droplet acts as the catalyst for an individual nanowire.

Furthermore, the substrate material is not limited to Si, or even a single material, and for example, insulators such as sapphire can be used as a substrate. Generally any material that can be made soluble or suspended in an appropriate catalyst may be utilized in the formation of a nanowire by the methods of the present invention. Such materials include, but are not limited to Group II, III, IV, V, and VI materials or alloys thereof.

The metal catalyst can be a material other than Au as well, and also need not be limited to a single material (e.g. the use of various alloy materials is contemplated). By way of example, GaN nanowires can be fabricated on a C-sapphire substrate using an Ni catalyst and a vapor of Ga and $NH_3$. Here, preferred growth would be in the (002) direction. Furthermore, the nanowire can be doped with Mn by using a mixture of $MnO_2$ and C. Similarly, a Ga(Co)N nanowire can be grown by using an Ni catalyst, C-sapphire substrate and Ga+$NH_3 \rightarrow$Co doping by $Co_3O_4$+C mixture. A GaN nanowire can also be grown by using a Ni catalyst, C-sapphire substrate and $Ga_2O_3$+C mixture. Alloyed Ga—N—Zn—O nanowires can be grown by using an Ni catalyst, C-sapphire substrate and Ga+$NH_3 \rightarrow$layer by ZnO+C mixture.

EXAMPLE 2

High temperature TEM was used to observe the growth of a Ge nanowire in situ. Here, small numbers of Ge particles were dispersed on TEM grids together with Au nanoclusters and served as the Ge vapor source when the sample stage was heated in the vacuum chamber. It was observed that the melting of Au clusters initiated after the Ge—Au alloy formation. This was followed by an increase of the liquid droplet size during the Ge vapor condensation process. When the droplet supersaturates with the Ge component, the Ge nanowire spits out (is ejected) from the alloy droplet and starts to grow. The real-time observation of the nanowire growth directly mirrors the mechanism shown in FIG. 12.

Based on these observations, several aspects of nanowire growth control are immediately apparent:

(1) Inorganic nanowires with different compositions (e.g. Si, Ge, GaAs, CdSe, GaN, AlN, $Bi_2Te_3$, ZnO, and others) can be synthesized by using suitable metal catalysts, gas precursors and reaction temperatures. The latter can be determined by examining the binary or ternary phase diagram (2) Conventional dopants such as B, Ph, As, In and Al can be used.

(3) Materials can be selected from types III–V, II–VI, II–IV, etc. and can include quaternaries and tertiaries, as well as oxides. Essentially any semiconductor material and its alloys can be used as adjacent materials in a nanowire heterostructure according to the present invention.

(4) To the first order approximation, the nanowire diameter is determined by the catalyst size. Smaller nanoclusters will yield thinner nanowires. This has also been successfully demonstrated in the GaP and Si nanowire system.

Synthesis methods of the present invention share some features of surfactant-mediated epitaxial growth in that the mediating material (in the form of a molten metal nanoparticle or a monolayer, respectively) catalyzes the epitaxial growth by inhibiting the reconstruction of the semiconductor growth surface. Since there is no stable reconstruction that must be continually disassembled and reestablished, nanowire growth can occur selectively and at lower temperature than conventional epitaxial growth. The lower temperatures offer the opportunity to access new phases, to produce sharper interfaces, and to inhibit morphological evolution of the nanowire material during the growth process (e.g., Rayleigh breakup).

3.2 Altered Phase Equilibria.

The nanowire geometry provides the opportunity to synthesize phases not stable in bulk or thin-film form. As a result of the high surface-to-volume ratio, surface energy contributes more strongly to the total free energy terms in the free energy, especially for crystalline phases with highly anisotropic surface energies. For example, the equilibrium phase boundary between zincblende (cubic) and wurtzite (hexagonal) polytypes of III–V and II–VI semiconductors will shift in pressure and temperature relative to the bulk equilibrium boundary. For example, comparing a <111> oriented zincblende nanowire to a <0001> oriented wurtzite nanowire of the same composition, a cylindrical wurtzite nanowire will more closely approximate the equilibrium (Wulff) shape, exposing low surface-energy prismatic facets. The wurtzite phase has indeed been observed as the preferred phase of GaAs in previous research on nanowire synthesis by OMCVD. In addition, epitaxial relationship between the substrates and nanowires could also be utilized to trap metastable phases in nanowire forms. This strategy has been successfully used in thin film growth.

3.3 Heteroepitaxy in Nanowires.

Semiconductor heterostructures enable confinement of electrons and holes, guiding of light and selective doping, yet these interfaces must be dislocation-free if they reside in active regions of the device. The range of materials that can be grown by coherent epitaxy on a given substrate, and to a required thickness, is greatly limited by the lattice misfit. For a given lattice misfit, the equilibrium critical thickness for coherent epitaxy may be estimated with knowledge of the elastic properties of the film and the core energy and crystallography of a misfit dislocation (e.g., in-plane edge component of the burgers vector). Although coherent heteroepitaxial films can be grown well beyond the equilibrium critical thickness, the films are metastable to relaxation by dislocation mechanisms. The nanowire morphology produced by the methods of this invention provides the opportunity to markedly extend both the equilibrium and kinetic critical thicknesses (or equivalently, the lattice misfit that can be accommodated at a given thickness) due to the change in boundary conditions.

There are two primary effects. The first is the relaxation of the elastic boundary conditions normal to the growth direction. In the ideal thin film morphology, the strain energy stored in the coherent film per unit area increases linearly with film thickness. In a nanowire heterostructure, the "film" is constrained laterally only at the interface. As the nanowire "film" thickens, it will relax laterally so that the stored elastic strain energy saturates. In fact, some of the strain energy will also be stored on the "substrate" side, as this material may relax laterally as well. The result is that the equilibrium critical thickness for a given lattice mismatch will be extended relative to the thin-film value. Unlike the film case, there will be a finite range of lattice misfits that are associated with infinite critical thickness due to the saturation in stored elastic strain energy with thickness. Countering this first effect is the fact that the strain energy penalty associated with the misfit dislocation strain field is reduced due to the reduced volume of the nanowire. However, the core energy term remains and thus the first effect is expected to dominate.

3.4 Longitudinal Heterostructure Nanowires (LOHNs).

The success of semiconducting integrated circuits is largely determined by the capability of defect engineering through controlled doping. Defect engineering is expected to have even more profound effect on nanowires because not only will it contribute to doping and thereby lead to novel devices, it may also strongly influence electron scattering.

Figure 13:
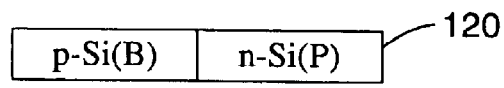
FIG. 13 is a schematic side view of a pn-type LOHN according to the present invention using Boron doped Si as the p-type material (p-Si(B)) and Phosphorus doped Si as the n-type material (n-Si(P)).
Figure 14:
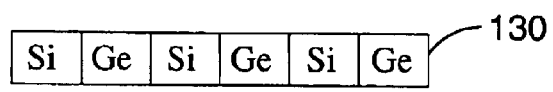
FIG. 14 is a schematic side view of an Si/Ge LOHN according to the present invention.

Using the methods described herein, compositional profiles such as shown in FIG. 10, FIG. 11, and FIG. 13 are generated along the wire axis through successive feed-in of different dopant gas. For example, to achieve a LOHN comprising a Si pn-junction as illustrated in FIG. 13, species such as $B_2H_6$ and $PH_3$ would be sequentially used during nanowire growth. The CVD process allows accurate growth control of the compositional profile and makes it possible to fabricate junctions with sharp compositional interfaces. 1-D superlattices 130 of Si/Ge and various III–V, II–VI, II–IV and tertiary and quaternary materials can also be fabricated using this approach as illustrated in FIG. 14. Therefore, by sequentially changing the gas used in the VLS process, LOHNs can readily be synthesized. The process will, in general, allow bandgap engineering in 1-D and thereby also allow fabricating a sequence of multiple quantum dots. Quantum dots are currently grown either in solution or through island formation during thin film growth. Because the location of these quantum dots is not known apriori, it becomes very difficult to make contacts with individual quantum dots. By precisely integrating quantum dots within a single nanowire, the problems of making contacts are eliminated. One thus obtains what we refer to as a "system on a nanowire." These novel 1D nanostructures offer great opportunities to explore new physics and phenomena for low dimensional systems. They can be potentially used as active nanoelectronic, nano-optical nanothermoelectric or nanoelectromechanical devices. It is also possible to synthesize nanowires of different crystal structures, such as zinc blende and wurzite CdSe and GaN nanowires. This can be achieved by using different substrates to trap certain metastable phases through the epitaxial growth relationship between the substrates and nanowires.

3.5 Co-Axial Heterostructure Nanowires (COHNs).

It is also possible to synthesize co-axial nanostructures such as shown in FIG. 2 using the as-made nanowires as physical templates. For example, conformal and uniform carbon coating on Ge nanowires can be obtained by decomposing organic molecules on the wire surface. This approach can be readily extended to create COHNs with strong electron confinement effect. For example, GaAs nanowires fabricated using VLS could be subsequently coated with a thin layer of $Al_{1-x}Ga_xAs$ by using low temperature chemical vapor deposition process that effectively avoids crystal growth along the wire axis and promotes surface overgrowth of $Al_{1-x}Ga_xAs$. Note, however, that the sheath can be crystalline or amorphous, and can include materials such as polymers, semiconductors, oxides, and the like. To form a COHN, a single-segment nanowire or a LOHN would first be formed according to any of the methods described herein. The single-segment nanowire or the LOHN, which will become the core of the COHN is then used as a template for forming the sheath. For example, the sheath can be formed by polymerization of monomers on the surface of the single-segment nanowire or the COHN. Alternatively, any physical vapor deposition (PVD) or chemical vapor deposition (CVD) process can be used to coat the single-segment nanowire or the LOHN. Examples of core/sheath materials, respectively, include, but are not limited to, Si and ZnO, Ge and C, Si and $SiO_2$, SnO2 and $TiO_2$, GaN and ZnO, GaAlN and GaN. Note that there is essentially an unlimited number of core/sheath material configurations. Even oxides, such as ZnO, can be used for the core material. The following is a list of core/sheath configurations where, for example, both the core and the sheath are monocrystalline: $TiO_2/SnO_2$; $M:TiO_2/SnO_2$ (M=Mn, Fe, Co, Cr, etc.); $PbTiO_3/SnO_2$; $BaTiO_3/SnO_2$; $LaMnO_3/SnO_2$; and $HTSC/SnO_2$ (high temperature semiconductor—HTSC); GaAs/GaAlAs.

Note also that this approach can be used to synthesize a nanotube. For example, a Ge nanowire core could be coated with an organic molecular material. The surface of the organic material would then be carbonized by pyrolysis in a vacuum. The Ge nanowire core would then be melted or evaporated at a temperature ranging from approximately 800° C. to approximately 1000° C., thereby forming a carbon nanotube. In addition, the same process may be utilized to form a "nanocylinder", in which a COHN structure is formed and the core is then differentially etched away, leaving only the outer sheath (or cylinder). This cylinder may be made from any of the materials from which a sheath may be made, including but not limited to C, Si and $SiO_2$, SnO2 and $TiO_2$, GaN and ZnO, GaAlN and GaN. It will be appreciated that structural characterization of these nanowires will rely heavily on transmission electron microscopy (TEM) and X-ray diffraction (XRD). Both XRD and TEM will allow for determining the structure/phase of the nanowires. In addition, TEM will provide further information on the defect structures within individual wires, the local microstructure at the interface, growth direction, and overall crystallinity.

4. Nanowire Properties.

4.1 Electronic Structure and Properties.

4.1.1 Modeling.

Figure 15:
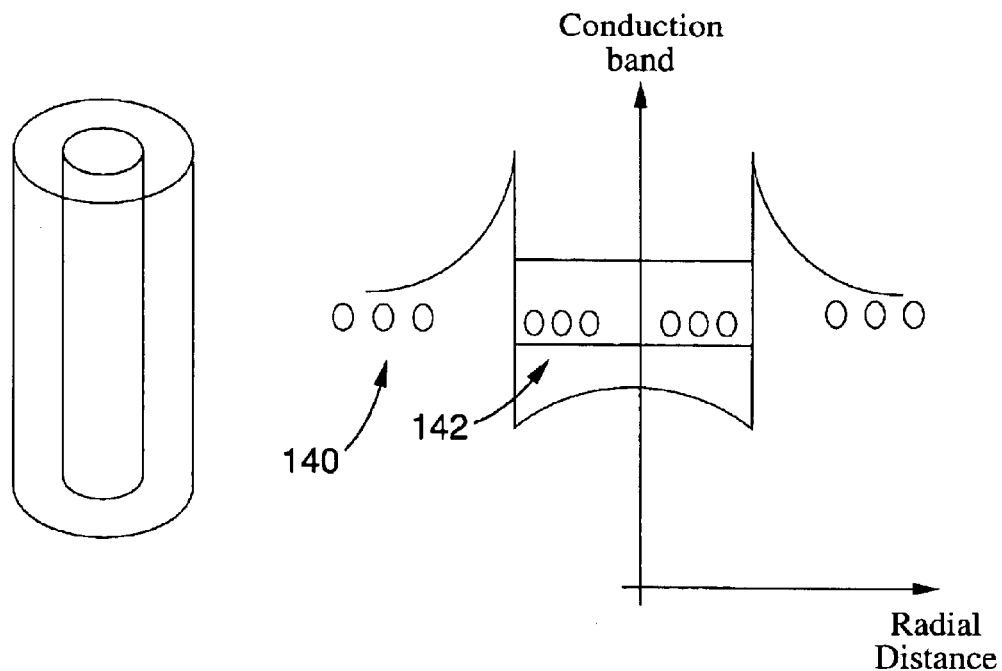
FIG. 15 is a conduction band diagram of a coaxial heterostructure nanowire (COHN) according to the present invention.
Figure 16:
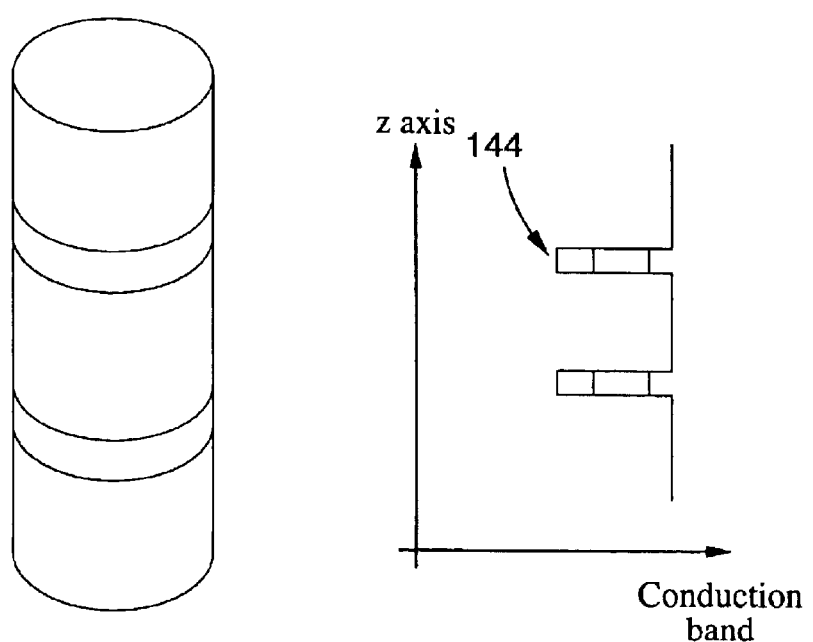
FIG. 16 is a conduction band diagram of a longitudinal heterostructure nanowire (LOHN) according to the present invention.

The role of interface roughness and localization in nanowires has been extensively studied in quantum wires defined using electron beam lithography or using electrostatic confinement with split gate method. The transition from ballistic to diffusive transport, positive and negative magneto resistance, conductance quantization and universal fluctuations have been observed at low temperatures. Nanowires fabricated using the process of the present invention provide a unique opportunity to study electron transport in a variety of 1D electronic materials. In addition, the possibility to dope the nanowires similar to CVD deposited thin film materials gives an extra degree of freedom to investigate dominant scattering mechanisms at various electron densities. Referring to FIG. 2 and FIG. 15, in COHNs, modulation doping of wider bandgap material will allow spatial separation of ionized dopants 140 and free carriers 142, and thus higher mobilities could be achieved. Confining free carriers to the core region inside the nanowire sheath will reduce the surface scattering effects. When electrons occupy cylindrical regions next to the heterostructure interface in coaxial nanowires, new quantized whispering gallery electronic states can also be formed. Referring to FIG. 16, heterostructures along the direction of a LOHN nanowire will allow formation of quantum dot states 144. These states can significantly affect electronic properties of nanowires. One could observe coulomb blockade as well as 1D resonant tunneling features.

In certain embodiments, modeling is preferably carried out in two stages. First, simple 1D band structure models and relaxation time approximation are used to estimate electron mobility along the nanowires at higher temperatures. More elaborated models are then utilized, such as variable range hopping, to take into account the surface/interface scattering and calculate the temperature dependence of electrical conductivity. Other factors, such as modifications in phonon spectra and scattering times, electron-phonon interaction, and so forth may be studied using Monte Carlo simulations of the Boltzmann equation. Note that heterostructure nanowires can contain several confined and interface phonon modes that can scatter electrons differently from what one may find in bulk semiconductors.

4.1.2 Characterization.

In order to characterize the electronic properties of bulk and heterostructure nanowires, it is important to measure the doping concentration profile along the nanowire, electron mobility, potential barrier at the hetero interfaces, etc. Conventional bulk or thin film characterization methods have to be carefully examined before applying to nanowire materials. Electrical conductivity along the nanowire is an important parameter and should be characterized over a wide range of temperatures. In addition, measurement of the magneto resistance will give more information how the surface scattering affects electron transport. Measurement of the thermoelectric properties (Seebeck coefficient) will give more information about the features of the electronic density-of-states and scattering mechanisms near the Fermi surface. Measurement of thermionic emission current can be used to determine the heterostructure barriers along the nanowire direction.

Ballistic Electron Emission Microscopy (BEEM) is one of the ideal techniques to measure the "localized" electronic properties of nanowire structures and characterize the coaxial heterostructures. BEEM is a powerful low energy electron microscopy technique for lateral imaging and spectroscopy (with nm resolution for buried structures placed up to 30 nm below the surface). The BEEM technique has been used to study a variety of self-assembled quantum dot structures grown on GaAs.

EXAMPLE 3

Figure 17:
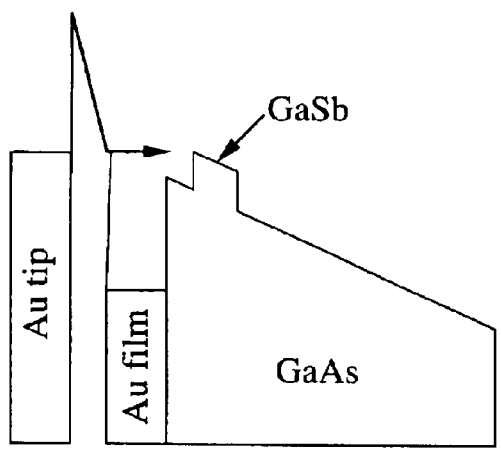
FIG. 17 is a schematic of a band profile for a GaAs capped, GaSb self-assembled quantum dot according to the present invention.
Figure 18:
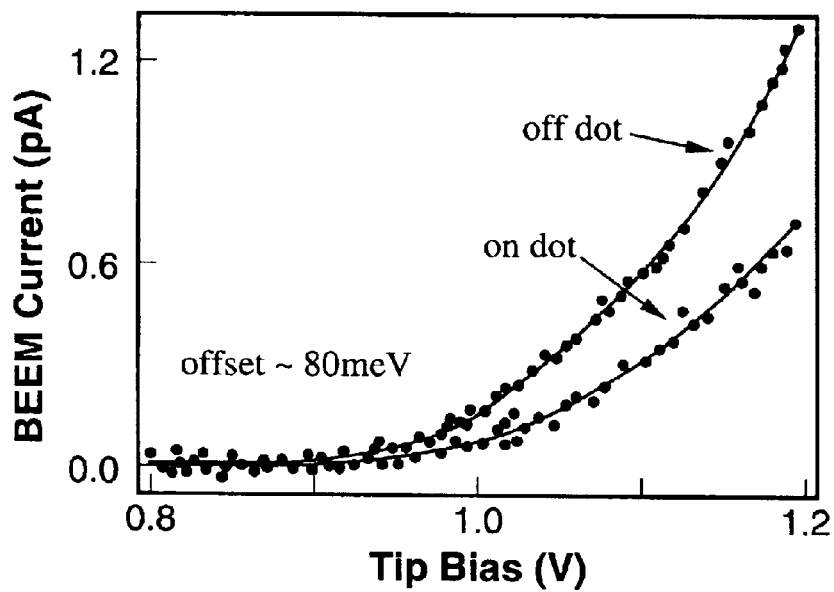
FIG. 18 is a graph showing the characteristic Ballistic Electron Emission Microscopy (BEEM) spectra for the GaSb/GaAs self-assembled quantum dot profiled in FIG. 17.

GaSb quantum dots grown on GaAs were observed through STM and BEEM images. In the STM image, a roughly circular feature ~50 nm in diameter and ~5 nm tall, marked the lateral position of the buried dot. The area in the BEEM image aligned with the dot profile in STM was darker than the surrounding region, implying that the BEEM current through the dot is reduced due to electrons reflection off the potential barrier of the dot. The height of this barrier (i.e. the local band offset) can be extracted from the changes in BEEM spectra between the on and off cases. The on dot and off dot BEEM spectra of several dots were fitted by using a modified Bell-Kaiser planar tunneling model, giving a local conduction band offset for GaSb dots on GaAs of 0.08±0.02 eV. FIG. 17 shows the band profile and FIG. 18 shows the characteristic BEEM spectra for GaSb/GaAs self-assembled single quantum dots.

In addition to measuring properties such as the heterojunction band offset, the technique has been used to study the electronic band structure of new materials such as Ga $As_{1-x}$ Nx alloys, the effect of ordering on the band structure of GaInP and resonant tunneling through InP quantum dots confined between AlInP barriers.

Figure 19:
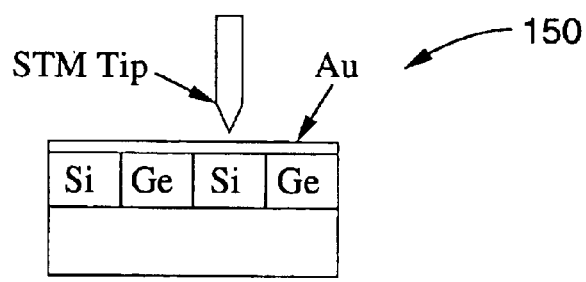
FIG. 19 is a schematic diagram of a BEEM configuration to determine the local electronic band structure of an Si/Ge LOHN according to the present invention.

It is clear that BEEM can be used to characterize the electronic properties not only of the individual nanowires, but also the variation of longitudinal heterostructures of the type described herein, as illustrated in the configuration 150 of FIG. 19. Confinement effects would lead to structure in the BEEM current which can be analyzed through second-derivative (SD) BEEM spectroscopy.

4.2 Optical Properties.

Observing light emission from nanowires is extremely challenging because of the role of surface states and non-radiative recombination at these states. With the use of coaxial heterostructure nanowires (COHNs) electrons are confined in the center regions inside the wire. The effect of free surfaces is thus reduced. Photoluminescence spectroscopy in a wide range of temperatures can be used to study light emission from nanowires, taking advantage of super-resolution techniques in order to obtain images with sub-wavelength spatial resolution. Additionally, scanning solid immersion lenses can be used to characterize localized light emission from individual nanowires. Fabrication and characterization of pn junctions in nanowires is one of the key building blocks for optoelectronic devices. DC and pulsed electrical and optical methods can be used to measure photocurrent, recombination lifetime and electroluminescence in nanowires.

4.3 Thermal Properties.

Thermal properties of semiconductors are generally dominated by transport of acoustic phonons. The thermal conductivity due to phonons can be related to two fundamental characteristics: (i) phonon dispersion relation; and (ii) phonon lifetime. Thermal conductivity can be calculated using the relation $$k = \frac{1}{3}\sum_p \int v^2(p,\epsilon)\tau(r,p,\epsilon)\frac{df_{BE}(\epsilon,T)}{dT}\epsilon D(p,\epsilon)d\epsilon$$

where p is the phonon polarization, $v(p,\epsilon)$ is the group velocity which is a function of the polarization and energy, $\epsilon=\hbar\omega$ is the phonon energy, $f_{BE}(\epsilon,T)$ is the Bose-Einstein equilibrium distribution, T is the temperature, $D(p,\epsilon)$ is the density of states, and $\tau(r,p,\epsilon)$ is the phonon lifetime as a function of position, polarization and energy. At room temperatures ($T=0.1\theta_D, \theta_D$:Debye temperature), the thermal conductivities of most bulk semiconductors are limited by phonon Umklapp scattering.

Phonon transport in nanowire heterostructures can be vastly different from that in bulk semiconductors mainly because the dispersion relation is significantly modified due to impose confinement in two directions. Second, the presence of heterostructure interfaces introduce phonon modes which exist at the interfaces. These result in many different phonon polarizations other than the two transverse and one longitudinal acoustic branches found in bulk semiconductors. These changes in the dispersion relation modifies the group velocity and the density of states of each branch. The changes in phonon temperatures come from two sources. First, the phonon-phonon interactions can change because selection rules based on energy conservation and wave-vector relations depend on the dispersion relation. Second, boundary scattering can be much stronger in nanowires (5–50 nm diameter) than in bulk semiconductors. Finally, because nanowire confinement can allow us to access new crystalline phases, the phonon dispersion relation can be drastically modified.

Figure 20:
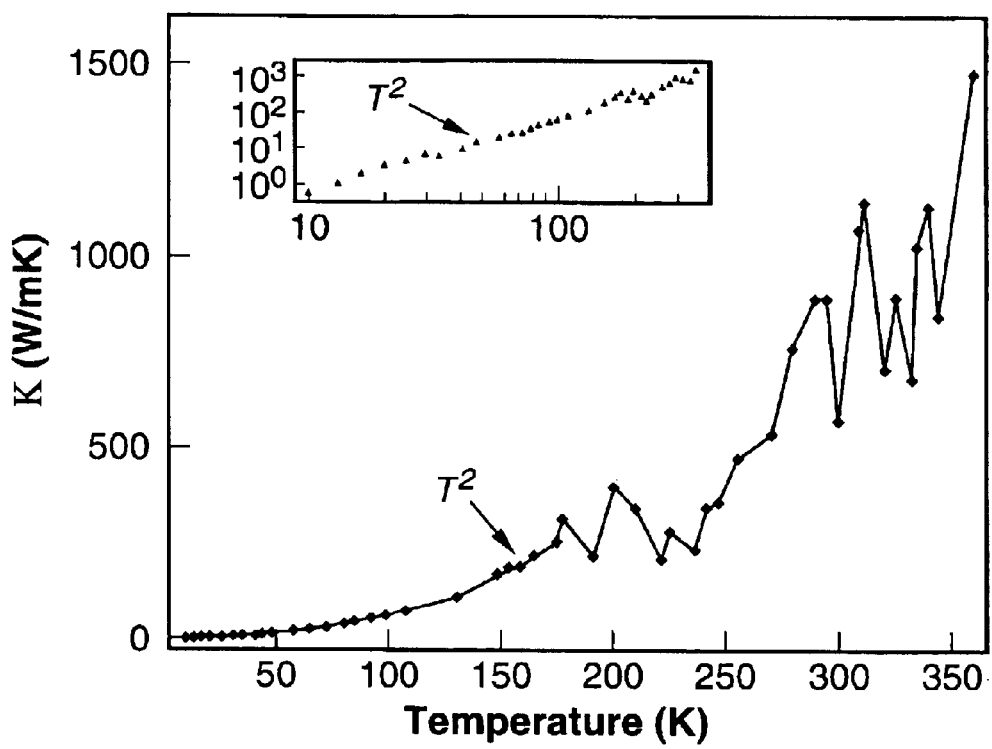
FIG. 20 is a graph showing the thermal conductivity of a multiwall carbon nanotube bundle as a function of temperature, where the I° behavior suggests phonon confinement in 2-D and the monotonic increase in thermal conductivity at high temperatures indicates suppression of phonon-phonon scattering and the presence of very long (≈1 $\mu$m) mean free paths.

The thermal and thermoelectric properties of nanowires according to the present invention can be measured using a microfabricated structure comprising two suspended heaters that contain e-beam lithographically fabricated wires. As a test, a multiwall carbon nanotube bundle was placed across the two heater sections so that the two heater sections were bridged. By monitoring the heat input from one heater and the temperature of both heaters, the nanotube thermal conductivity was extracted. FIG. 20 plots the thermal conductivity as a function of temperature of the multiwall carbon nanotube from 10° K to 350° K, indicating a $T^2$ behavior suggestive of phonon confinement in a 2-D material. The monotonic increase in thermal conductivity indicates suppression of phonon-phonon scattering and the presence of very long (e.g., ≈1 μm) mean free paths. This approach can also be used for measuring thermal conductivities of COHNs and LOHNs according to the present invention. In addition, batch-fabricated atomic force microscope (AFM) probes were employed with temperature sensors on the tip for scanning thermal microscopy (SThM) to thermally and thermoelectrically characterize COHNs and LOHNs locally.

In certain embodiments, nanowire characterization computations focus on three aspects: (i) calculation of phonon dispersion relations, (ii) calculations of phonon lifetimes based on dopant scattering, nanowire size and boundary scattering, and three-phonon enharmonic interactions, and (iii) phonon transport calculations. Because wave effects (phonon bandgaps) are already accounted for in the dispersion relations, phase randomizing scattering may be assumed. Under these circumstances, the Boltzmann transport equation may be solved using Monte Carlo simulations where it is simple to account for the density of states of different polarization branches in a nanowire, as well as frequency dependent group velocities and phonon lifetimes.

4.4 Thermoelectricity.

Figure 21:
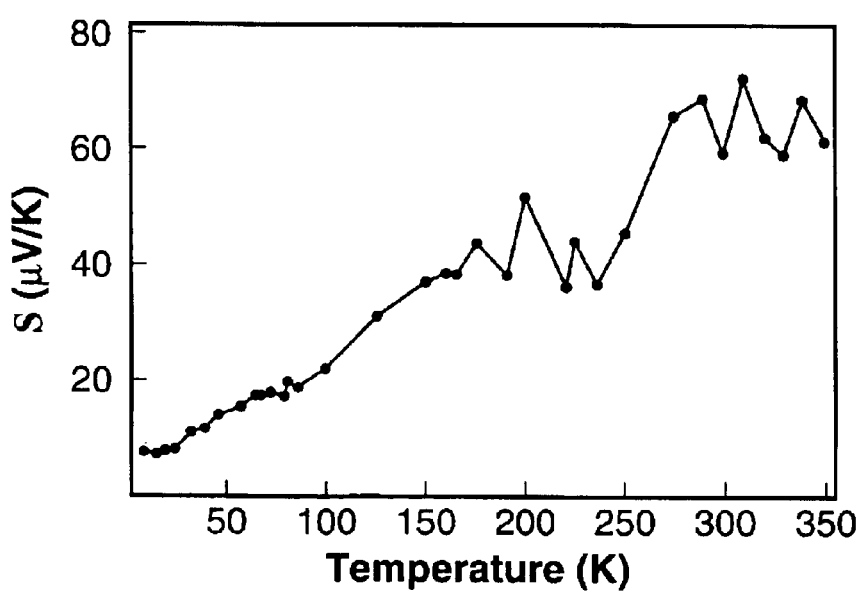
FIG. 21 is a graph showing thermopower measurements of a multiwall carbon nanotube using a microfabricated measurement structure comprising two suspended heaters that contain e-beam lithographically fabricated wires according to the present invention, with the multiwall carbon nanotube bundle placed across the two heater sections so that the two heater sections were bridged.

The thermopower of a semiconductor depends fundamentally on three properties: (i) the density of electronic states near the Fermi level, (ii) the electron effective mass, and (iii) carrier scattering rates. Because the electronic band structure (density of states and scattering rate) can be dramatically changed by quantum confining the electrons in a nanowire, one could engineer the band structure and the position of the Fermi level in order to tailor the thermopower. The suspended heater device described above can measure both temperature and potential difference across a nanowire. For example, FIG. 21 shows the thermopower measurements of multiwall carbon nanotubes in the 10° K to 350° K temperature range. The appearance of a positive thermopower indicates holes as the dominant carriers in these carbon nanotubes. Therefore, this device can be used to measure thermopower of nanowire heterostructures such as COHNs and LOHNs described above.

4.5 Piezoelectric Properties.

The wurtzite structure supports a spontaneous electric dipole moment, and thus materials with this structure are both pyroelectric and piezoelectric. These properties permit strong linear coupling between applied mechanical stress and polarization (direct piezoelectric effect), between applied electric field and strain (converse piezoelectric effect), and between a change in temperature and a change in polarization (pyroelectric effect). Wurtzite nanowires (e.g., GaAs, InAs, GaN, AIN, ZnO, etc) and nanowire heterostructures are thus potentially useful as sensors and actuators at the nanoscale. Potential applications include integrated atomic force microscopy probes, resonant mass sensors with single-molecule sensitivity, nanoscale thermal sensors, electric-field-tunable GHz filters, large displacement nanobeam actuators, and nanoscale flow sensors.

In <0001> wurtzite nanowires, the spontaneous polarization is oriented along the wire axis. Thus, electric fields and metal mechanical stress applied along the wire axis will generate the largest piezoelectric response. The simplest electrode configuration utilizes contacts at the base and at the tip. Longitudinal stress applied with the tip and base contacts will be sensed by the direct piezoelectric effect. Since the wire cross-sectional area is small, large stresses can be generated with small forces. With the nanowire used as a resonant sensor, one end of the nanowire must be mechanically free, and a conductive surface in close proximity will be used to detect charge on the nanowire tip and to remove or add charge by tunneling.

Figure 22:
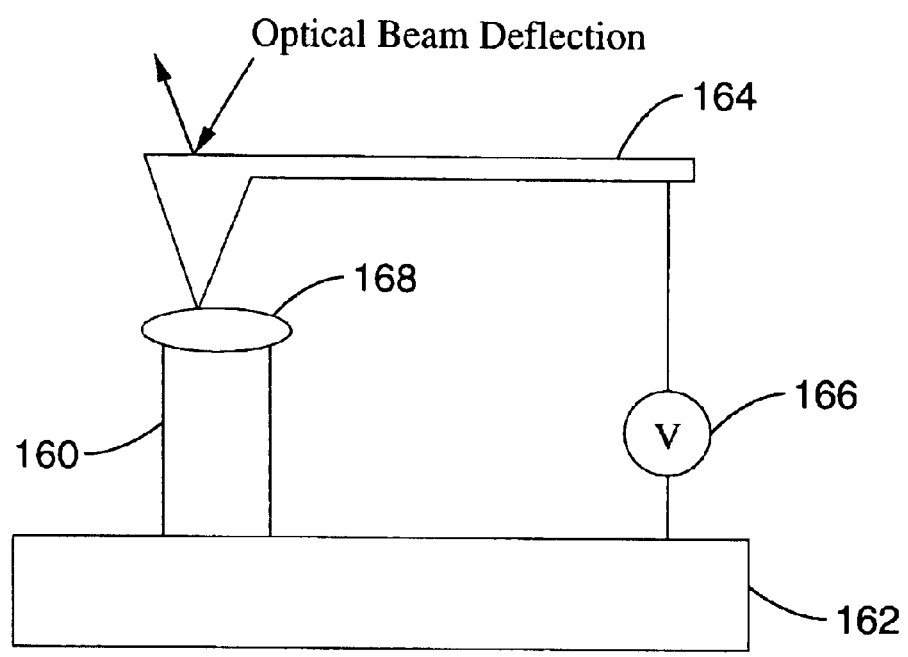
FIG. 22 is a schematic diagram of an experimental set for measuring the mechanical motion of a piezoelectric or pyroelectric nanowire according to the present invention using an atomic force microscope (AFM) cantilever probe while simultaneously measuring the electrostatic potential across the nanowire.

FIG. 22 shows an experimental setup to measure the mechanical motion of a piezoelectric or pyroelectric nanowire 160 on a conducting substrate 162 using an AFM cantilever probe 164 while simultaneously measuring the electrostatic potential across the nanowire with a voltage sensor 166. The tip of the AFM probe contacts the metal catalyst "cap" 168 on the nanowire for electrical and mechanical measurements.

5. Block-by-block Growth of Single-crystalline Si/SiGe.

Heterojunction and superlattice formation is essential for many potential applications of semiconductor nanowires in nanoscale optoelectronics. Accordingly, we have developed a hybrid Pulsed Laser Ablation/Chemical Vapor Deposition (PLA-CVD) process for the synthesis of semiconductor nanowires with longitudinal ordered heterostructures. The laser ablation process generates a programmable pulsed vapor source, which enables the nanowire growth in a block-by-block fashion with well-defined compositional profile along the wire axis. Single crystalline nanowires with longitudinal Si/SiGe superlattice structure have been successfully synthesized. This unique class of heterostructured one-dimensional nanostructures holds great potential in applications such as light emitting devices and thermoelectrics.

The success of semiconductor integrated circuits has been largely dependent upon the capability of heterostructure formation through carefully controlled doping and interfacing. In fact, 2-dimensional (2D) semiconductor interface is ubiquitous in optoelectronic devices such as light emitting diode, laser diodes, quantum cascade laser and transistors. Heterostructure formation in 1-dimensional (1D) nanostructures (nanowires) is equally important for their potential applications as efficient light emitting sources and better thermoelectrics. While there are a number of well-developed techniques (e.g. molecular beam epitaxy) for the fabrication of thin film heterostructures and superlattices, a general synthetic scheme for heterojunction and superlattice formation in 1D nanostructures with well-defined coherent interfaces is currently still lacking. Here, a hybrid Pulsed Laser Ablation/Chemical Vapor Deposition (PLA-CVD) process is described for the synthesis of semiconductor nanowires with periodic longitudinal heterostructures. Monocrystalline nanowires with Si/SiGe superlattice structure were obtained and thoroughly characterized using electron microscopy.

EXAMPLE 4

Figure 23:
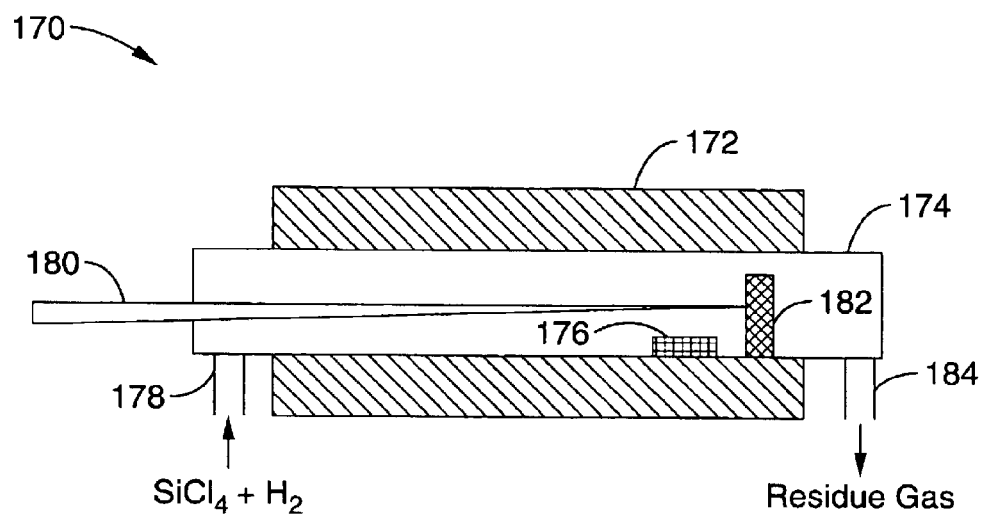
FIG. 23 is a schematic side view of a vapor-liquid-solid (VLS) growth chamber for block-by-block growth of a nanowire heterostructure using a pulsed laser.

Referring FIG. 23, an embodiment of a nanowire growth apparatus 90 in accordance with the present invention is illustrated. Growth apparatus 170 comprises a furnace 172 having a quartz reaction tube 174. A (111) Si wafer 176 coated with a thin layer of Au was put inside the quartz reaction tube 174 as substrate. A gas mixture of $SiCl_4$ and $H_2$ was continuously introduced into the reaction tube 174 through an inlet 178. A computer programmed laser pulse 180 was focused on a pure Ge target 182. Residue gas was exhausted through an outlet 184.

Figure 24:
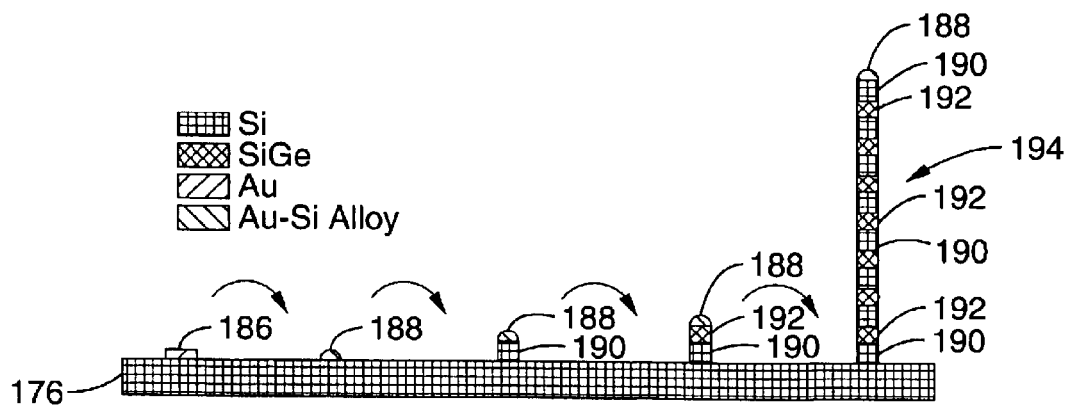
FIG. 24 is a schematic process flow diagram illustrating vapor-liquid-solid (VLS) type growth of a 1-dimensional Si/SiGe superlattice structure according to the present invention using the growth chamber shown in FIG. 23.

Referring now to FIG. 23 and FIG. 24 together, nanowire growth using Au as a metal solvent at high temperature as previously described and illustrated in FIG. 12. This process starts with the dissolution of gaseous reactants in nanosized liquid droplets of the metal solvent, followed by nucleation and growth of single crystalline wires. The concept of heterostructured nanowires requires accurate compositional profile and interface control at nanometer or even atomic level while maintaining a highly crystalline and coherent interface along the wire axis. Based on our fundamental mechanistic understanding of VLS nanowire growth, this level of control is made possible here through successive feed-in of different vapor sources.

In one embodiment of the present invention, the size and size-distribution of the nanowire heterostructures can be controlled by using preformed and size controlled nanocrystal catalysts to form the nanowires.

Referring to the process flow diagram of FIG. 24, in the example illustrated Si/SiGe superlattice nanowires were synthesized by generating a Ge vapor in pulsed form through the pulsed ablation of the pure Ge target 182 with a frequency-doubled Nd-YAG laser (wavelength 532 nm, 6 Hz, power density 10 J/cm² per pulse). The flow rate of the $H_2$ was approximately 100 sccm, the ratio of $SiCl_4$ and $H_2$ was approximately 0.02, and the system pressure was atmospheric pressure. The reaction temperature typically ranged from approximately 850° C. to approximately 950° C. At this temperature, the Au thin film 186 forms a liquid alloy with Si and spontaneously breaks up into nanometer sized droplets of Au—Si alloy 188. Next, the Si species continuously deposit into Au—Si alloy droplets where growth of the Si nanowire 190 is initiated upon supersaturation. When the laser is turned off, only Si species deposit into the alloy droplet and a pure Si block is grown. However, if the laser is turned on during the growth process, Ge vapor will be generated and both Ge and Si species will be deposited into the alloy droplets. When the laser is turned on, SiGe alloy 192 then precipitates out from the solid/liquid interface. By periodically turning the laser on and off (this sequence can be easily programmed), an Si/SiGe superlattice 194 is formed on every individual nanowire in a block-by-block fashion. The entire growth process resembles the living polymerization synthesis of block copolymer.

It will be appreciated that various other nanowire structures can be grown using different gases and targets. For example, PbSe can be grown by laser ablation of a PbSe/Au target in Ar gas. Furthermore, growth of a nanowire superlattice according to the present invention is not limited to the foregoing synthetic process. One alternative approach would be to use multiple target materials and steer the laser with a computer for selection of target materials. Additionally, essentially any physical or chemical vapor deposition process that uses vapor supplies could be used, including, but not limited to, PLD, CVD, and MBE. For example, the vapor supplies could be configured with computer controlled valves to pulse the flow of the desired gas.

EXAMPLE 5

Figure 25:
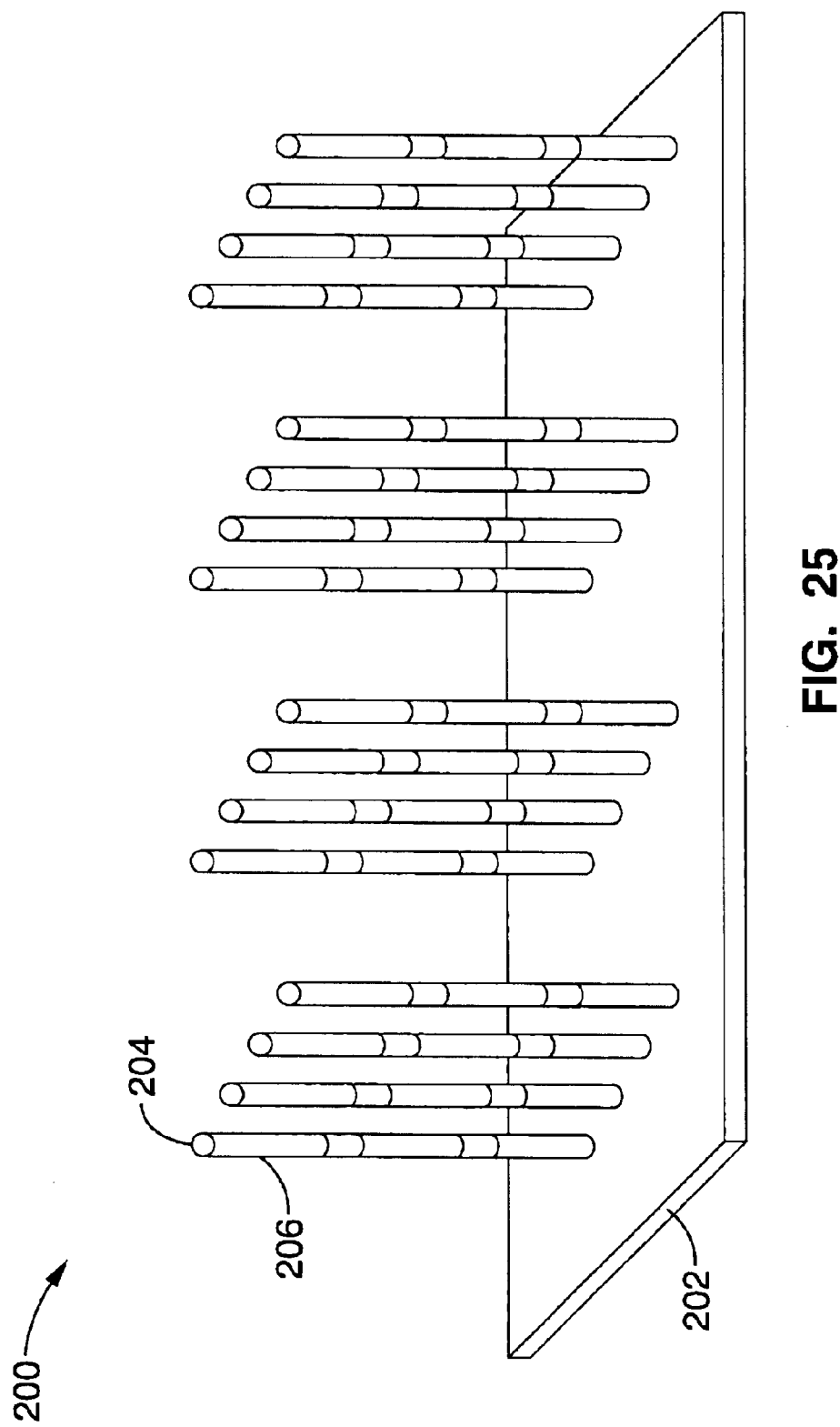
FIG. 25 is a schematic perspective view of an Si/SiGe superlattice nanowire array according to the present invention.
Figure 26:
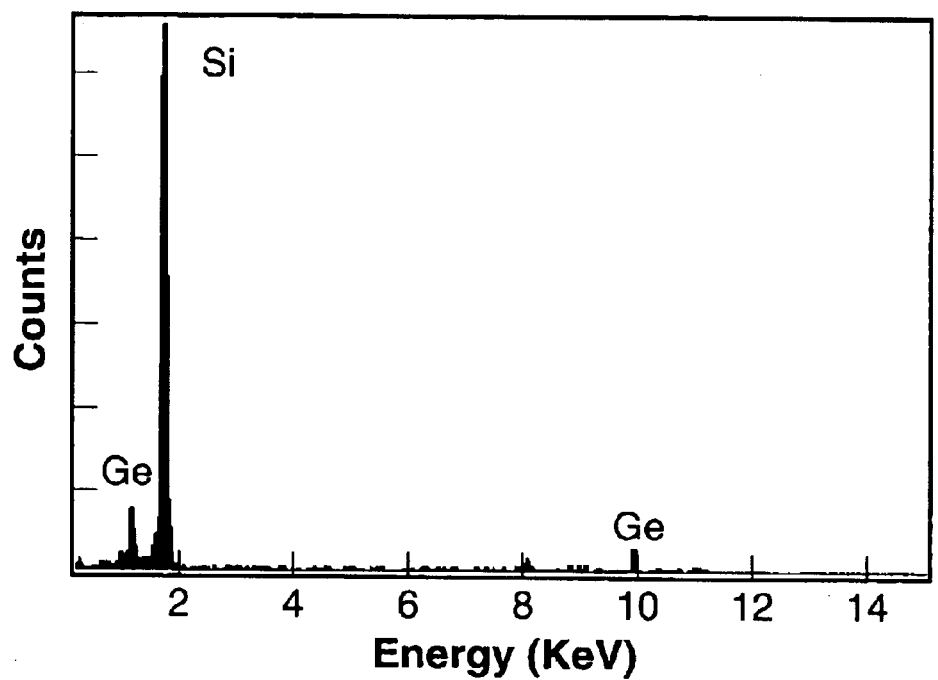
FIG. 26 is a graph showing the energy-dispersive X-ray spectroscopy (EDS) spectrum of the Ge rich region on a Si/SiGe superlattice nanowire according to the present invention.
Figure 27:
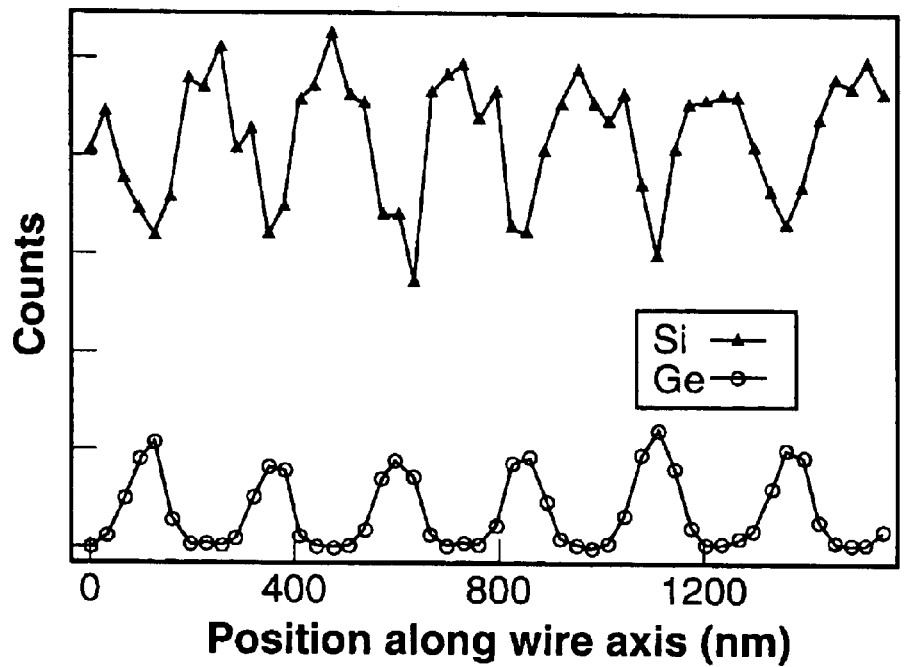
FIG. 27 is a graph showing the line profile of the EDS signal from the Si and Ge components along the growth axis of a Si/SiGe superlattice nanowire according to the present invention.

A nanowire array 200 as depicted schematically in FIG. 25 was synthesized using the process described in Example 4 and a scanning electron microscopy (SEM) image of the synthesized nanowire array was obtained. In the example shown, an Au film having a thickness on the Si (111) substrate 202 of 20 nm was lithographically patterned into four sites. Each film site melted into four droplets which acted as the catalyst for a corresponding nanowire. During the growth process, the laser was periodically turned on for 5 seconds and off for 25 seconds, and the cycle was repeated for 15 min. As previously shown, Si nanowires grow preferably along [111] direction, which results in the oriented epitaxial nanowire array growth on the Si (111) substrate. The alloy droplets solidify and appear as a bright spot on the tip 204 of every nanowire 206. Close examination of the nanowires showed the tips as having a flower-like shape which is formed during the solidification of the liquid alloy droplet. The diameters of these nanowires ranged from approximately 50 nm to approximately 300 nm. Using a Philip CM200 transmission electron microscope (TEM) operated at 200 KeV, scanning transmission electron microscopy (STEM) images of two nanowires in bright-field mode showed dark stripes appearing periodically along the wire axes, which originated from the periodic deposition of SiGe alloy and Si segments. The electron scattering cross section of Ge atom is larger than that of Si. Consequently, the SiGe alloy block appears darker than the pure Si block. The chemical composition of the darker area was examined using energy-dispersive X-ray spectroscopy (EDS) which showed a strong Si peak and apparent Ge doping (~12 weight % Ge) as illustrated in FIG. 26. The periodic modulation of Ge doping was further confirmed by scanning a focused electron beam along the nanowire growth axis and tracking the change of X-ray signal from Si and Ge atoms in the wires as illustrated in FIG. 27. Both Si and Ge X-ray signals showed periodic modulation and intensities that were anti-correlated; in other words, wherever the X-ray signal from Ge showed a maximum, the signal from Si showed a minimum, which confirms the formation of Si/SiGe superlattice along the wire axis. We noted that the abruptness of the Si/SiGe interface in these nanowires is not ideal at this stage. It is believed that this could be improved by incorporating more precise and faster vapor dosing/switching schemes such as molecular beam process.

It must be emphasized that the elastic boundary conditions of heteroepitaxial growth offer the possibility to create dislocation-free interfaces in the superlattice nanowires that are not stable in the conventional 2D configuration achieved by epitaxial film growth on planar substrates. Although coherent heteroepitaxial films can be grown well beyond the equilibrium critical thickness, the films are metastable to relaxation by dislocation mechanisms. The VLS nanowire morphology provides an opportunity to markedly extend both the equilibrium and kinetic critical thicknesses—or equivalently, the lattice misfit that can be accommodated at a given thickness—due to the change in boundary conditions.

The highly crystalline nature of our superlattice nanowires was characterized by selected area electron diffraction (SAED) and high-resolution transmission electron microscopy (HRTEM). An SAED pattern was recorded perpendicular to a nanowire long axis. The pattern was then indexed as the diffraction along the [110] zone axis of crystalline Si and suggested the nanowire growth does occur along [111] direction. This was further confirmed in the HRTEM image which clearly showed the (111) atomic planes (separation 0.314 nm) perpendicular to the nanowire axis. While the interface contrast was readily seen in the STEM images, we were not able to resolve the interface in HRTEM mode due to low doping percentage in SiGe blocks. These HRTEM images, however, clearly demonstrated the high crystallinity of the Si/SiGe superlattice nanowires. Extensive HRTEM imaging indicated that the monocrystallinity of the Si/SiGe superlattice nanowire is maintained along the entire wire length with few linear or planar defects.

Taken together, the structural and chemical composition data showed that nanowires prepared by the PLA-CVD method according to the present invention are highly crystalline with Si/SiGe superlattice structure along the nanowire axis. The diameters of the nanowires, the concentration of Ge and the period of chemical modulation can be readily controlled by adjusting the reaction conditions. The nanowire diameter is influenced by the thickness of Au layer on substrate. For example, with 20 nm thick Au thin films, the average diameter of nanowires is around 100 nm. If the thickness of Au is reduced to 1 nm, the average diameter can be reduced to 20 nm. The diameter is also affected by the reaction temperature, wherein lower temperatures result in thinner nanowires. The concentration of Ge in the superlattice is controlled by the ratio of Ge atoms and Si atoms deposited into the alloy droplets. Increasing the laser intensity or decreasing the flow rate of $SiCl_4$ can increase the concentration of Ge. In addition, the superlattice period (L) is the product of growth rate (V) and laser on-and-off period (T): $L = V \times T$. Therefore, by reducing the growth rate or the laser on-and-off period, we are able to reduce the superlattice period. Similarly, the ratio of different compositional blocks can be readily adjusted by varying the laser on/off ratio.

Figure 28:
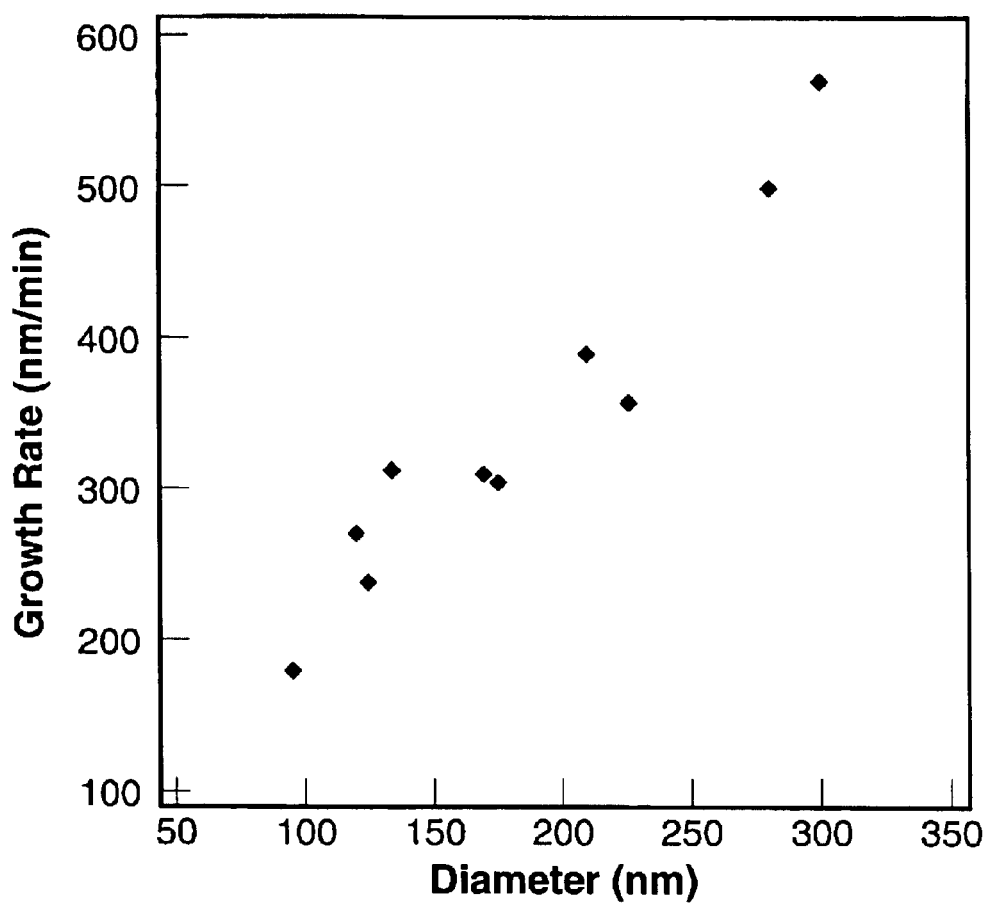
FIG. 28 is a graph showing an example of the correlation between the growth rate of a nanowire according to the present invention and the diameter observed.

Importantly, by putting these "labels" along the wire growth axis, the PLA-CVD process provides a quantitative way to measure the growth rate of nanowires ($V = L/T$) and its correlation with growth supersaturation. While the laser on-and-off period T is preset, knowing the superlattice period L, the growth rate V can be accurately calculated. We found that the growth rate is diameter-dependent under the same reaction conditions. The smaller the nanowire diameter, the slower is the growth rate as illustrated in FIG. 28 which shows the correlation between growth rate and diameter observed in our experiment. The trend can be qualitatively explained by the Gibbs-Thomson effect, such as increasing Si vapor pressure and thereby decreasing supersaturation as the nanowire diameter becomes smaller. The decrease of supersaturation as a function of nanowire diameter (d) is given as $$\frac{\Delta\mu}{kT} = \frac{\Delta\mu_0}{kT} - \frac{4\Omega\alpha_{vs}}{kT}\frac{1}{d}$$

where $\Delta\mu$ is the effective difference between the chemical potentials of Si in the nutrient (vapor or liquid) phase and in the nanowire, $\Delta\mu_0$ is the same difference at a plane interface, $\alpha_{vs}$ is the specific free energy of the nanowire surface and $\Omega$ is the atomic volume of Si. The dependence of the crystal growth rate V on the supersaturation is generally non-linear and in many cases is of nth power:

$$V = b\left(\frac{\Delta\mu}{kT}\right)^n$$

where b is a coefficient independent of the supersaturation. This naturally leads to a linear dependence between $V^{1/n}$ and 1/d as in $$\sqrt[n]{V} = \frac{\Delta\mu_0}{kT}\sqrt[n]{b} - \frac{4\Omega\alpha_{vs}}{kT}\sqrt[n]{b}\frac{1}{d}$$

where $$\frac{\Delta\mu_0}{kT} = \frac{4\Omega\alpha_{vs}}{kT}\frac{1}{d_c}$$

and $d_c$ is the critical diameter.

Our Si/SiGe nanowire growth data can be readily fitted with n=2. This observation agrees well with the classical CVD crystal growth studies on micrometer-sized Si whiskers by Givargizov.

The hybrid PLA-CVD methods described herein can be used to prepare various other heterostructures on individual nanowires in a "custom-made" fashion since part of the vapor source supplies (laser ablation) can be programmed. It will enable the creation of various functional devices (e.g. p-n junction, coupled quantum dot structure and heterostructured bipolar transistor) on single nanowires. These nanowires could be used as important building blocks for constructing nanoscale electronic circuit and light emitting devices. As an example, superlattice nanowires with reduced phonon transport and high electron mobility are believed to be better thermoelectrics.

6. Nanowire-based Energy Conversion Devices.

Those skilled in the art will appreciate that the nanowires described herein may be used in a wide variety of applications, including, but not limited to, (a) thermoelectric refrigerators; (b) light emitting diodes; and (c) electromechanical sensors. The design of these devices flows directly from the fundamental scientific understanding of the effect of 1-D confinement on various physical properties. Although such scientific understanding can rely on single nanowire studies, it will be appreciated that devices will require multiple nanowires for integration into systems. Therefore, arrays of nanowires would typically be employed.

EXAMPLE 6

For purposes of discussion we will focus on the three devices stated above; however, they are by no means the only devices possible using nanowires.

6.1 Thermoelectric Refrigeration and Power Generation.

Solid-state refrigeration and power generation can be achieved using the Peltier effect, whereby a current flow across thermoelectric junctions produces can produce cooling (or heating). Conversely, a temperature difference across a thermoelectric material generates a current flow across a potential drop, and thereby electrical power. Compared to current vapor-compression refrigerators and gas-based engines, such solid-state devices are extremely promising because: (i) they do not contain any moving parts; (ii) they are environmentally benign; and (iii) allow for miniaturization. The reason they are not currently widely used is because their performance (efficiency for engines and coefficient of performance (COP) for refrigerators) is much inferior to gas/vapor based systems. If, however, the performance could be improved to be comparable or better than the vapor based systems, one could envision a drastic change in how we utilize or convert energy. This provides a strong and compelling reason to develop thermoelectric devices based on nanowires. As discussed below, this can only be achieved using nanowires according to the present invention.

Figure 29:
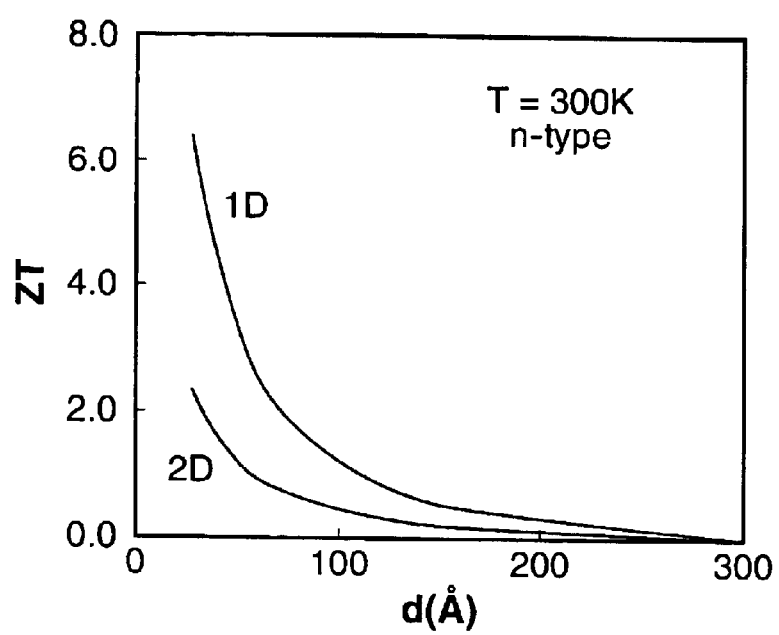
FIG. 29 is a graph illustrating calculated dependence of ZT on Bi quantum well (2D) and quantum wire (1D) dimensions.

The materials used for solid-state thermoelectric refrigerators and power generators are characterized by a figure of merit, $ZT=S^2\sigma T/k$, where S is the thermopower, k is the thermal conductivity, $\sigma$ is the electrical conductivity, and T is the absolute temperature. $Bi_2Te_3$ and its alloys are currently the most widely used materials and have a ZT=1. It can be theoretically shown that if ZT=3, the performance of thermoelectric refrigerators and engines can be comparable to those of vapor compression ones. In fact, if thermoelectric materials are nanostructured, quantum confinement of electrons and phonons can drastically increase their ZT, as illustrated in FIG. 29. 1-D nanowires in particular could reach ZT≈2 to 5 if the wire diameter lies in the range of 5 nm to 10 nm.

6.1.1 Nanowire Design.

Because high electron mobility provides high ZT, it is preferably to use COHNs since they will have much reduced dopant and interface scattering. The thermopower of COHNs can be tailored through bandgap engineering. Because thermal conductivity of materials is generally inversely proportional to the atomic mass ($\zeta$), a high-$\zeta$ material would be the material of choice. It is for this reason that Bi or Bi2Te3 nanowires are good candidates for thermoelectric applications. The thermal conductivity can be further reduced by decreasing the nanowire diameter since boundary scattering is expected to be dominant for nanowire diameters less than 20 nm at room temperatures. In addition to Bi2Te3, other materials can be used, such as SiGe or InGaAs where alloy scattering can reduce phonon transport.

6.1.2 Device Design.

Figure 30:
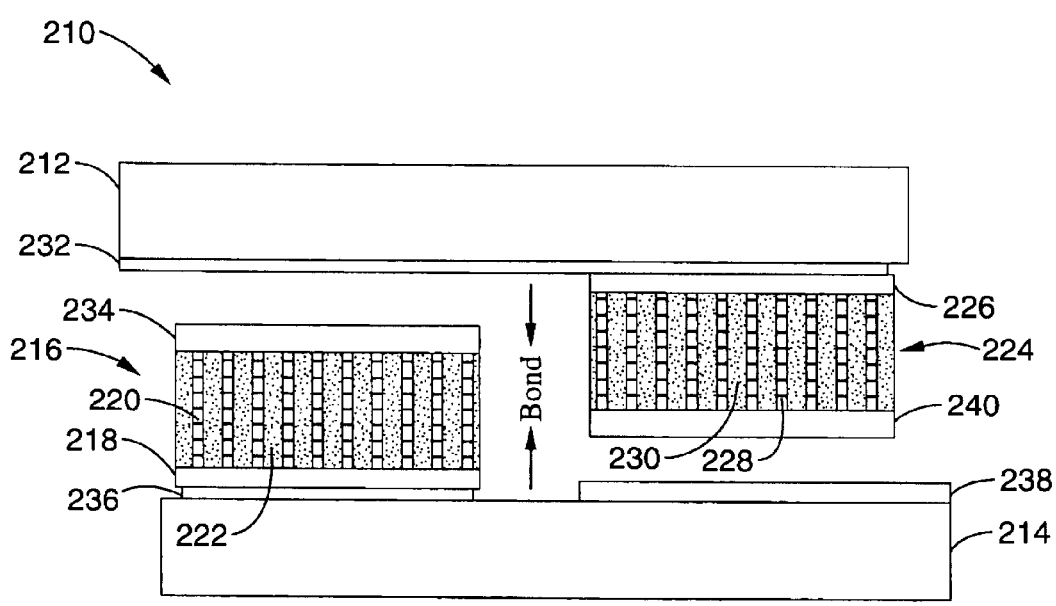
FIG. 30 is a schematic side view of an embodiment of a thermoelectric device according to the present invention based on a composite of n- or p-doped thermoelectric nanowire arrays embedded in a polymer matrix.

Because nanowires are fragile, they should be embedded in a matrix to provide mechanical strength. For example, arrays of $Bi_2Te_3$ or SiGe COHN nanowires would be embedded in a polymer or dielectric material as illustrated in FIG. 30 to form a thermoelectric device 210. The thermoelectric device 210 in FIG. 30 comprises upper and lower electrically insulating substrates 212, 214, respectively, an n-doped nanowire array 216 that is separately grown on a substrate 218 and wherein the nanowires 220 are embedded in a polymer matrix 222, and a p-doped nanowire array 224 that is separately grown on a substrate 226 and wherein the nanowires 228 are embedded in a polymer matrix 230. The wafers of n- and p-doped thermoelectric nanowire arrays are the brought together and bonded to with a series electrical connection and a parallel thermal connection to make a thermoelectric cooler or power generators. These connections are achieved by forming and connecting metal contact pads 232, 234, 236, 238 and 240 as shown. The nanowire arrays can be easily embedded in a polymer matrix by flowing a polymer solution after the nanowires are fabricated, and then curing it using heat or UV radiation. To make the upper contacts 234, 240 (i.e., at the tips of the nanowires), the polymer will be preferentially etched down till the nanowires are exposed, after which metal contact pads are deposited.

The design parameters for such a composite are: (a) surface density of nanowires; and (b) thickness of the device. The idea is to exploit the ultra-low thermal conductivity of polymers (k≈0.1 W/m-K) and the high power factors ($S^2\sigma$) of the nanowires in order to achieve high ZT. Device performance can be characterized by measuring (a) effective electrical conductivity of the device; (b) effective thermal conductivity of the device; (c) effective Seebeck coefficient; (d) temperature difference across the device in response to a current flow; and (e) electrical power in response to a temperature difference or heat flow rate.

6.2 Light-Emitting Devices.

Nanowire composite materials have two distinct properties that can be used for light emitting device applications. On one hand, the low dimensional confinement of electrons and quantization of energy levels can be used for tuning of absorption and emission wavelength. The 1D nature of crystal growth along the nanowire could permit higher flexibility in the lattice mismatch between different materials and thus wider change in absorption and emission spectra. On the other hand, Si and III–V semiconductors have an index of refraction (3–4) that is much higher than air or silica fiber (1–1.5). This creates a mode size mismatch that is one of the main difficulties to couple light between fibers and semiconductor devices. This also limits the external quantum efficiency of light emitting diodes, since most of the emitted photons are reabsorbed in the material.

Figure 31:
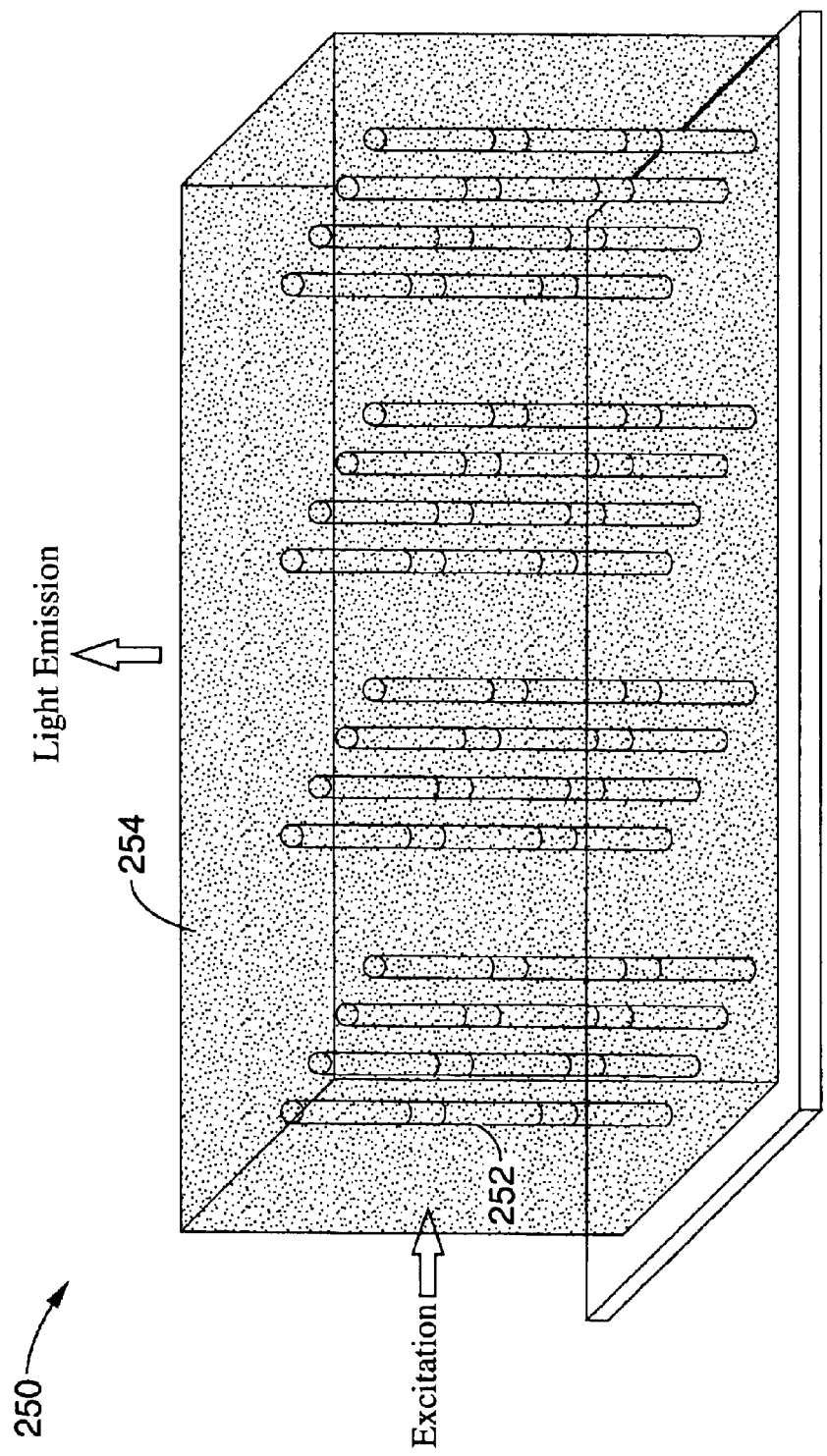
FIG. 31 is a schematic perspective view of a nanowire-polymer composite array according to the present invention configured for light emission.

Based on the scientific understanding of the electronic band structure of various II–V and II–VI nanowires, nanowires can be designed for efficient absorption and emission of photons. For example, referring FIG. 31, a nanowire-polymer composite array 250 can be made by integrating a plurality of semiconductor nanowires 252 into a polymer matrix 254 as previously described, thus producing an optically active material with a much lower effective index. The change in polymer refractive index with temperature is typically an order of magnitude higher than conventional semiconductors. This large thermo-optic coefficient can be combined with electronic-electronic properties of semiconductor nanowires to produce novel energy conversion devices.

Preferably, nanowires with the highest radiative efficiencies are integrated inside the polymer matrix in order to fabricate and characterize light emission devices. In addition, by using a mixture of nanowires made from different materials, one can achieve wider emission spectra and white light behavior.

Referring to FIG. 32, an electron ejection light emitting diode/laser diode 260 is shown schematically as comprising a nanowire 262 having pn junction 264 formed from growth of an n-type semiconductor 266 and a p-type semiconductor 268. A positive electrode 270 and negative electrode 272 are attached to the n- and p-type materials, respectively. Application of a potential across the electrodes will cause light emission by electron ejection as depicted in FIG. 32. This structure can be formed using, for example, ZnO, Si/Ge, and GaN with appropriate dopants.

Referring to FIG. 33, using longitudinal heterostructure nanowires (LOHNs) 280, one can make single quantum dot LEDs and study the effect of quantum dot size and material on the emission spectrum. The unique geometry of the quantum wire allows delivery of electrons and holes directly to the dots 282 and thus avoids the paths where electrons and holes would recombine in other places. Quantum dots can be formed using, for example, Si/Ge, PbSe/PbTe, arid $Bi_2Te_3/Sb_2Te_3$. One could even put the composite nanowire-polymer medium inside a vertical cavity distributed dielectric mirror to provide for optical feedback and study the stimulated emission and laser action.

Additionally, sophisticated T-shaped, V-grooved and Ridge quantum wire lasers and also quantum dot lasers have can be fabricated and characterized. These devices have unique properties due to 1D and 0D nature of electronic density of states. In particular, the increase in the differential gain will improve the high speed modulation characteristics. Size variation is also used to change electronic energy states and the emission spectrum. We expect that light emission in COHNs and LOHNs will create a new class of energy conversion devices where opto-electronic properties can be tailored beyond what can be achieved with current methods.

6.3 Nanowire Device Flexibility.

As can be seen, therefore, nanowires according to the present invention can be used for fabricating a variety of devices in addition to those described above, including, but not limited to:

(a) High electron mobility nanowires (using COHNs).

(b) High electron mobility nanowire field-effect transistors (using COHNs and applying external bias to deplete/enhance a channel).

(c) Nanowire based infrared detectors (using LOHNs and embedded quantum dots).

(d) Nanowire based 1D resonant tunneling diodes (using LOHNs and embedded quantum dots).

(e) Nanowire based single electron transistors (using LOHNs and embedded quantum dots and possible combination with COHNs).

(f) Nanowire based infrared detectors (using COHNs and quantized whispering gallery electron modes).

(g) Nanowire magnetic sensors (using COHNs and the quantized whispering gallery electron modes which are affected under a magnetic field).

(h) Polymer-nanowire composite light emitting devices (high external quantum efficiency, broad spectrum, good coupling with fiber).

(i) Polymer-nanowire composite optical modulators (can make very high speed traveling wave modulators because the speed of electrical and optical signals could be matched).

(j) Polymer-nanowire composite optical detectors.

(k) Polymer-nanowire composite waveguides and couplers (by growing nanowires with directional channels between the nanowires).

(l) Polymer-nanowire composite optical switches.

(m) Polymer-nanowire composite lasers (edge emitting, distributed feedback or vertical cavity structures).

Figure 34:
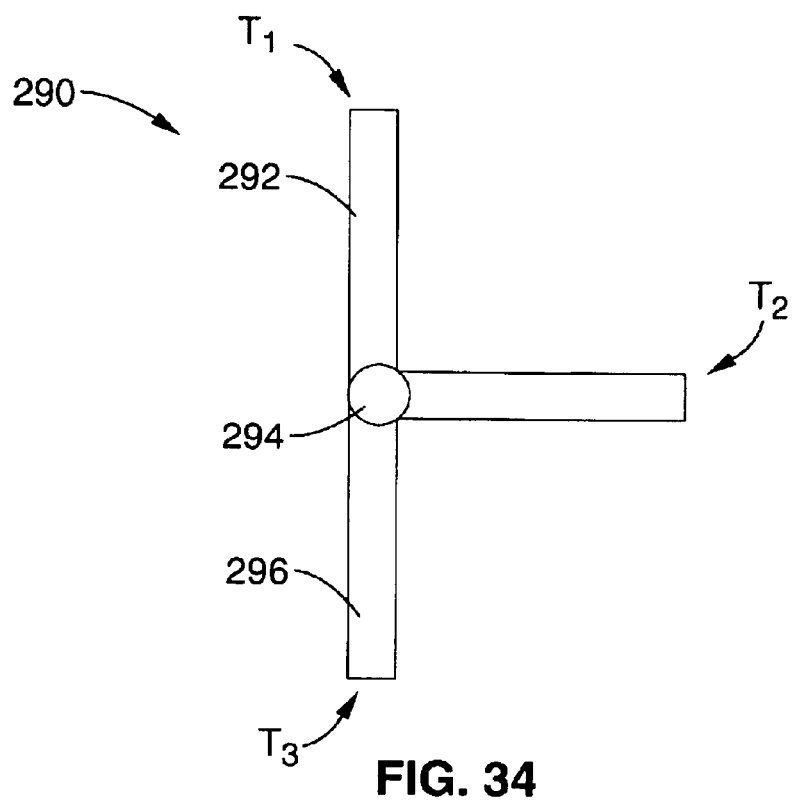
FIG. 34 is a schematic view of an embodiment of a 3-terminal nanowire device according to the present invention.
Figure 35:
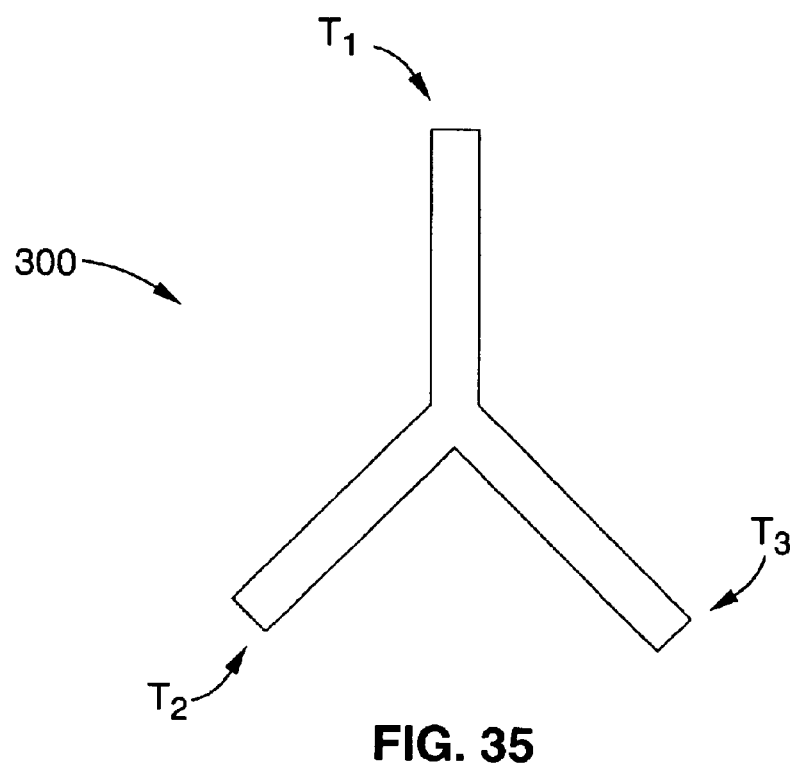
FIG. 35 is a schematic view of a second embodiment of a 3-terminal nanowire device according to the present invention.

It will also be appreciated that LOHNs can be used to fabricate multi-terminal devices (i.e., N>2) such as pnp devices. FIG. 34 shows an example of a 3-terminal pnp LOHN 290 fabricated with a p-type material 292, n-type material 294, and p-type material 296 and having terminals $T_1$, $T_2$ and $T_3$. FIG. 35 illustrates another example of a 3-terminal LOHN 300.

6.4 Nanoelectromechanical Devices.

Nanowire pyroelectric and piezoelectric devices have, in principal, the following inherent features that distinguish them from film or bulk devices:

(a) High quality factors: The lack of extended defects should enable high mechanical quality factors in nanowire resonators. The low defect density also suggests low loss tangents and thus a high electromechanical coupling figure-of-merit (proportional to $(\tan \delta)^{-1}$).

(b) High surface-to-volume ratio: The low mass per unit length, combined with the high ratio of adsorption sites to the nanowire volume will permit resonant detection of mass increments at sensitivities approaching the single molecule level.

(c) Variable length without change in materials quality: Nanowire longitudinal resonators can be made at various lengths from submicron to tens or hundreds of microns, thus allowing the fabrication of sensors or actuators with a wide range of fundamental resonant frequencies.

(d) Nanoscale Diameter: The small diameter permits the use of piezoelectric and pyroelectric nanowires as direct probes of forces at the atomic and molecular scale, and temperature at the nanoscale. Furthermore, "nanobeam" unimorph benders with longitudinal electrodes and elastic layers fabricated by shadow evaporation will be capable of very large deflections clue to length: thickness aspect ratios approaching 1000:1 and the large transverse electric fields possible with moderate voltages (e.g., 100 MV/m for 1 V applied across a 10 nm thick nanobeam).

Figure 36:
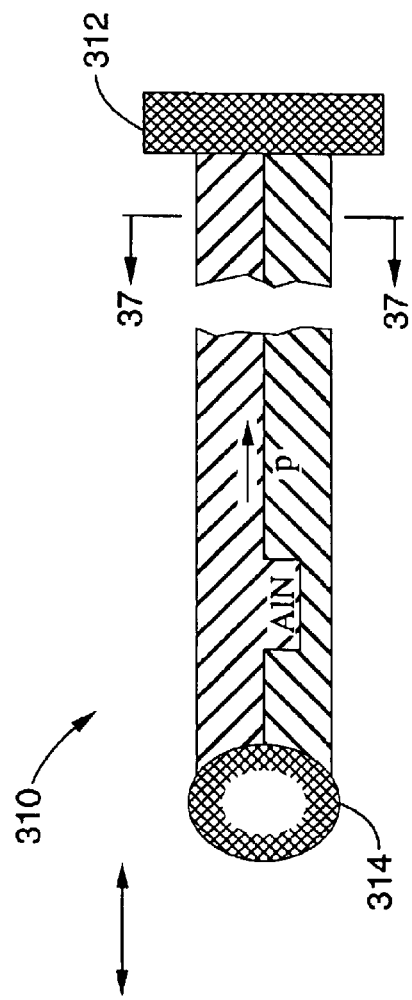
FIG. 36 is a schematic side view of an embodiment of a longitudinally configured electromechanical transducer based on nanowires according to the present invention.
Figure 37:
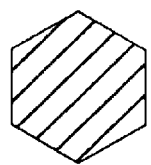
FIG. 37 is cross-section view of the transducer shown in FIG. 36 taken through line 37—37.
Figure 38:
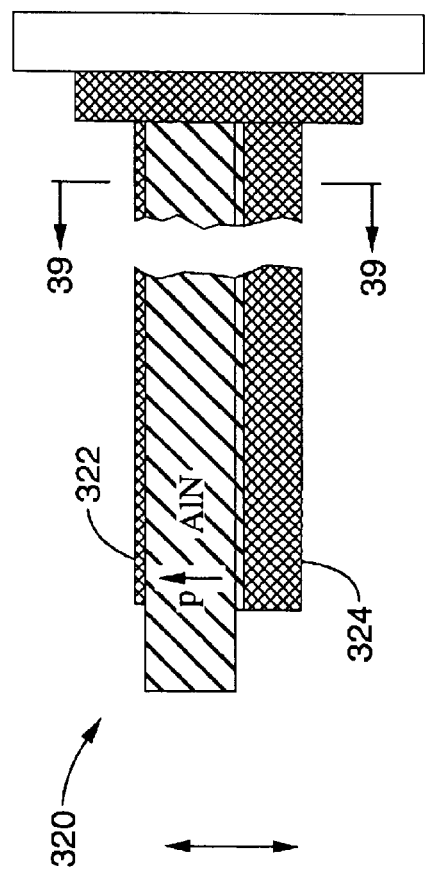
FIG. 38 is a schematic side view of an embodiment of a transverse configured electromechanical transducer based on nanowires according to the present invention.
Figure 39:
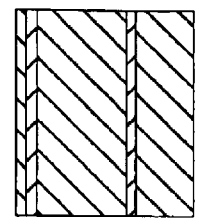
FIG. 39 is a cross-section view of the transducer shown in FIG. 38 taken through line 39—39.

Referring to FIG. 36 through FIG. 39, examples of nanowire device configurations for electromechanical transducers are illustrated. FIG. 36 and FIG. 37 illustrate a longitudinal configuration, while FIG. 38 and FIG. 39 illustrate a transverse configuration.

Referring first to FIG. 36 and FIG. 37, in <0001> wurtzite, the spontaneous polarization is longitudinal, i.e., oriented along the wire axis. Thus, electric fields and mechanical stress applied along the wire axis will generate the largest piezoelectric response. In the longitudinal configuration 310, the simplest electrode configuration utilizes contacts (electrodes) 312, 314 at the base and at the tip, respectively. Longitudinal stress applied with the tip and base contacts will be sensed by the direct piezoelectric effect. Since the wire cross-sectional area is small, large stresses can be generated with small forces. For example, a uniaxial tensile force of 100 nN corresponds to a uniaxial stress of 100 MPa for a wire with a cross-sectional area of $(10 \text{ nm})^2$. A piezoelectric coefficient of 5 nC/N will thus generate a change of polarization of 0.5 $C/m^2$, a value that is certainly detectable. With the nanowire used as a resonant sensor, one end of the nanowire must be mechanically free, and a conductive surface in close proximity will be used to detect charge on the nanowire tip and to remove or add charge by tunneling.

Referring now to FIG. 38 and FIG. 39, a completely distinct sensing and actuation capability can be expected from wurtzite nanowires in <hki0>orientation, that is, with the spontaneous polarization perpendicular to the wire growth direction. Such nanowires can be grown by choosing the appropriate surface orientation of the single-crystal substrate, e.g. sapphire with substrate with (0001) or (hki0) orientation. In this transverse configuration 320, electrodes may be placed at the wire ends, thus activating the piezoelectric shear mode, $d_{15}$, or along the wire length, employing $d_{31}$. In the $d_{31}$ mode shown in FIG. 38 where electrodes 322, 324 are placed along the wire length, it is possible to exploit the expected large electric breakdown strength (>300 MV/m) and high fracture strength of defect-free AlN nanowires to fabricate both high-displacement nanobeam unimorph benders and force sensors. Presuming that a suitable elastic layer is shadow deposited on one side of the nanowire, opposite an electrode stripe, the tip displacement, $\delta$, of the nanowire will be on the order of $d_{31}L^2V/t^2$. For transverse voltage of 1V, thickness of 10 nm, length of 5 $\mu$m and $d_{31}$ of 3 pm/V, the tip displacement is expected to be about 0.75 $\mu$m.

The transverse configuration represents synthesis and processing challenges beyond those expected for the longitudinal configuration. For example, the nanowire must be nucleated in the transverse orientation, which will likely require nucleation on a crystalline wurtzite substrate or seed. Once nucleated, the surface energy anisotropy is expected to yield nanowires of rectangular cross section, ideal for shadow deposition. Based on the substantial literature on lateral growth experiments with GaN, it is likely that the growth rate of transverse nanowires will greatly exceed that of longitudinal wurtzite nanowires. Once synthesized, nanobeam unimorph benders may be fabricated by shadow deposition of metallic layers—one thin compliant metallization to serve as an electrode (e.g., Cr/Au), and a second stiffer layer on the opposite side (e.g., Ti/Pt) to serve both as an electrode, and as an elastic layer to optimize the position of the neutral axis for bending-mode actuation. Alternatively, it is possible to make use of the substantially different surface properties of the opposing basal faces to selectively deposit metals by solution processing.

6.5 Room-Temperature Ultraviolet Nanowire Nanolasers.

Development of short-wavelength semiconductor lasers is of great current interest. This has culminated in the realization of room-temperature green-blue diode laser structures with ZnSe and $In_xGa_{1-x}N$ as the active layers. ZnO is another wide band-gap (3.37 eV) compound semiconductor that is suitable for blue optoelectronic applications. In fact, ultraviolet lasing action has been reported in disordered ZnO particles and thin films. For wide band-gap semiconductor materials, a high carrier concentration is usually required in order to provide an optical gain that is high enough for lasing action in an electron-hole plasma (EHP) process. Such EHP mechanism, which is common for conventional laser diode operation, typically requires high lasing thresholds. As an alternative to EHP, excitonic recombination in semiconductors can facilitate low-threshold stimulated emission because of its bosonic nature. To achieve efficient excitonic laser action at room temperature, exciton binding energy ($E^b$ex) has to be much larger than the thermal energy at room temperature (26 meV). In this regard, ZnO is a good candidate since its $E^b$ex is approximately 60 meV, which is significantly larger than that of ZnSe (22 meV) and GaN (25 meV).

To further lower the threshold, low-dimensional compound semiconductor nanostructures have been fabricated, in which quantum size effects yield a substantial density of states at the band edges and enhance radiative recombination due to carrier confinement. The use of semiconductor quantum well structures as low-threshold optical gain media represents a significant advancement in semiconductor laser technology. Stimulated emission and optical gain have also been demonstrated recently in Si and CdSe nanoclusters and their ensembles.

In accordance with a further aspect of the invention, we have demonstrated the first excitonic lasing action in ZnO nanowires with a threshold of 40 kW/cm$^2$ under optical excitation. The chemical flexibility as well as one-dimensionality of the nanowires makes them ideal miniaturized laser light sources. These short-wavelength nanolasers could have myriad applications including optical computing, information storage, and nano-analysis.

EXAMPLE 7

ZnO nanowires were synthesized using a vapor phase transport process via catalyzed epitaxial crystal growth on sapphire (110) substrates. Patterned Au thin film was used as the catalyst for nanowire growth. For the nanowire growth, clean (110) sapphire substrates were coated with 10–35 Angstrom thick gold with or without using TEM grids as shadow masks (micro contact printing of thiols on Au followed by selective etching has also been used to create the Au pattern). An equal amount of ZnO powder and graphite powder were ground and transferred to an alumina boat. The Au-coated sapphire substrates were typically placed 0.5–2.5 cm from the center of the boat. The starting materials and the substrates were then heated up to 880° C. to 905° C. in an argon flow. Zn vapor was generated by carbothermal reduction of ZnO and transported to the substrates where ZnO nanowires grew. The growth generally took place within 2–10 minutes.

The nanowires were epitaxially grown on the substrate and formed highly oriented arrays. Selective nanowire growth can be readily achieved when patterned Au thin film was used. ZnO nanowires grew only in the Au coated area with an excellent selectivity due to the catalytic nature of Au thin layer. The area of these nanowire arrays can be readily extended to cm$^2$. Generally, the diameters of these wires are in the range of 20 nm to 150 nm while majority of them have diameters of 70 nm to 100 nm. The diameter dispersion is due to the inhomogeneous sizes of the Au nanocluster catalysts when the substrate is annealed during the growth process. The lengths of these nanowires can be varied between 2 µm and 10 µm by adjusting the growth time. This capability of patterned nanowire growth allows us to fabricate nanoscale light emitters on the substrate in a controllable fashion.

We observed that nearly all the nanowires grew vertically from the substrates. This is due to the fact that a good epitaxial interface exists between the (0001) plane of the ZnO nanowire and (110) plane of the substrate. The ideal a plane (110) of sapphire is two-fold symmetric while the ZnO c-plane is six-fold symmetric. They are essentially incommensurate with the exception that the ZnO's a -axis and the sapphire's c-axis are related almost exactly by a factor of 4 (mismatch less than 0.08% at room temperature). Such coincidental match up along the sapphire [0001] direction, along with a strong tendency of ZnO to grow in the c-orientation as well as the incoherence of interfaces in directions other than sapphire [0001], leads to the unique vertical epitaxial growth configuration. The anisotropy of the sapphire's a plane is critical for growing high quality c-oriented ZnO nanowire arrays.

SEM images of the nanowire array were obtained. Hexagon end planes of the nanowires could be clearly identified. This is a strong evidence that these nanowires grow along the <0001> direction and are indeed well-faceted both at the end and side surfaces. The well-faceted nature of these nanowires will have important implications when they are used as effective laser media.

Figure 40:
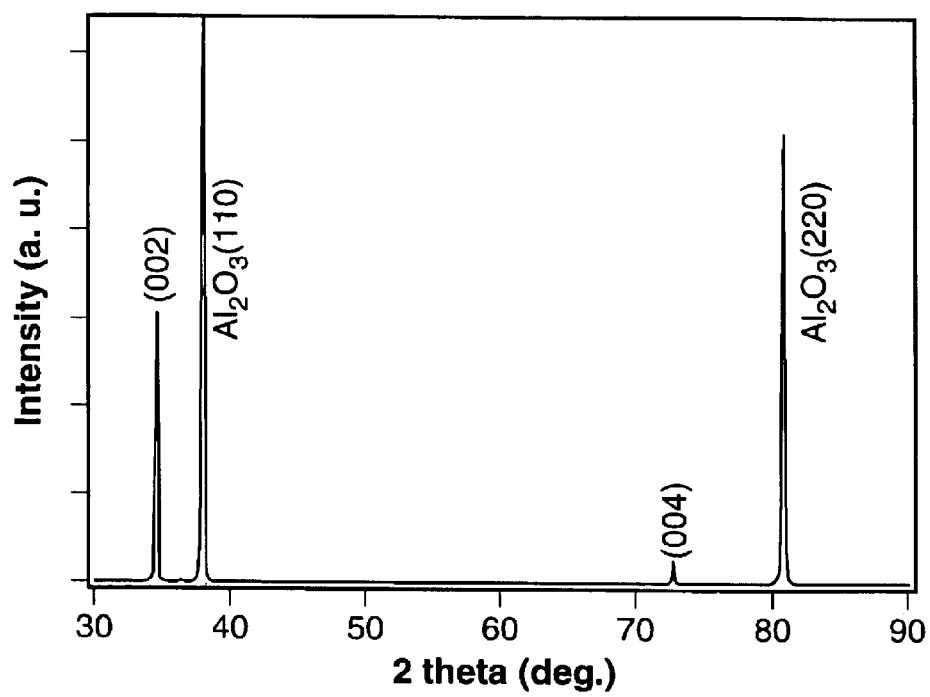
FIG. 40 is a graph showing an x-ray diffraction (XRD) pattern of a ZnO nanowire grown on a sapphire substrate according to the present invention.

Additional structural characterization of the ZnO nanowires was carried out using transmission electron microscopy (TEM). A high resolution TEM image of a single-crystalline ZnO nanowire was obtained. A spacing of 2.56±0.05 Angstroms between adjacent lattice planes corresponded to the distance between two (0002) crystal planes, further indicating that <0001> is the preferred growth direction for the ZnO nanowires. Significantly, this <0001> preferential nanowire growth on the sapphire substrate is also reflected in the X-ray diffraction pattern shown in FIG. 40 that was taken on a Siemens Z5000. Only (0001) peaks were observed, indicating excellent overall c-axis alignment of these nanowire arrays over a large substrate area.

Photoluminescence spectra of nanowires were measured using a He-Cd laser (325 nm) as an excitation source. Strong near-band gap edge emission at ~377 nm has been observed. In order to explore the possible stimulated emission from these oriented nanowires, the power dependent emission was examined. The samples were optically pumped by the fourth harmonic of Nd: YAG laser (266 nm, 3 ns pulse width) at room temperature. The pump beam was focused on the nanowires at an incidence angle of 10 degrees to the symmetric axis of the nanowire. Light emission was collected in the direction normal to the end surface plane (along the symmetric axis) of the nanowires. Stimulated emission from the nanowires was collected in the direction along nanowire's end-plane normal (the symmetric axis) using a monochromator (ISA) combined with a Peltier-cooled CCD (EG&G). All experiments were carried out at room temperature. Significantly, in the absence of any fabricated mirrors, we observed lasing action in these ZnO nanowires.

Figure 42:
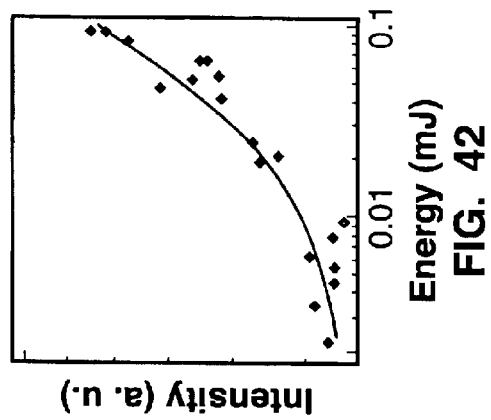
FIG. 42 is a graph showing integrated emission intensity from a ZnO nanowire on sapphire according to the present invention as a function of optical pumping intensity.
Figure 41:
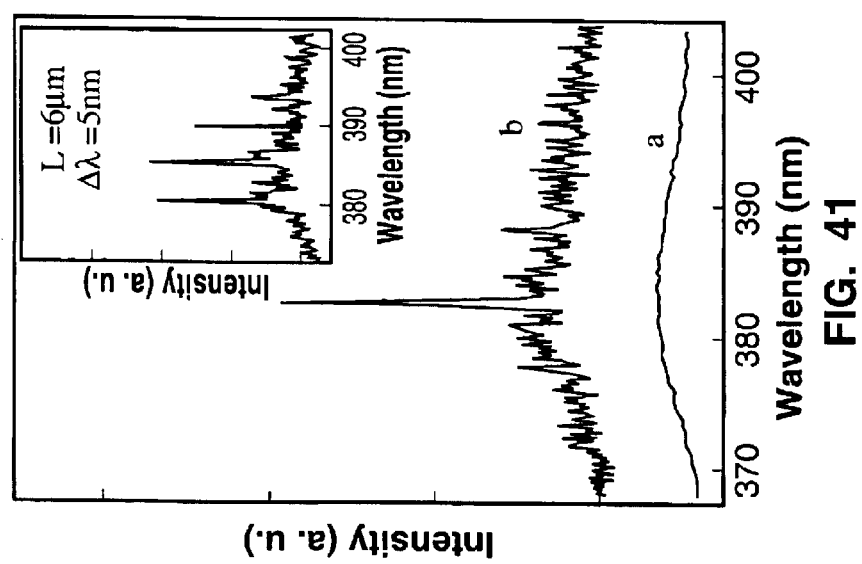
FIG. 41 is a graph showing the evolution of the emission spectra resulting from increasing pump power to a ZnO nanowire on sapphire according to the present invention where curve a shows the spectrum at excitation intensity below the lasing threshold, and curve b and the inset shows the spectra after the lasing threshold is exceeded.

FIG. 41 shows the evolution of the emission spectra as pump power was increased. At low excitation intensity (below the lasing threshold), the spectrum consists of a single broad spontaneous emission peak (curve a) with a full width at half maximum (FWHM) of approximately 17 nm. This spontaneous emission was 140 meV below the band gap (3.37 eV) and is generally ascribed to the recombination of excitons through exciton-exciton collision process where one of the exciton radiatively recombines to generate a photon. As the pump power increased, the emission peak narrows due to the preferential amplification of frequencies close to the maximum of the gain spectrum. When the excitation intensity exceeded the lasing threshold (~40 kW/cm$^2$), sharp peaks emerge in the emission spectra (curve b and inset). The pump power for these spectra were 20, 100, and 150 kW/cm$^2$, respectively. The line widths of these peaks are less than 0.3 nm, which are more than 50 times smaller than the line width of the spontaneous emission peak below the threshold. Above the threshold, the integrated emission intensity increases rapidly with the pump power, as shown in FIG. 42. The narrow line width and the rapid increase of emission intensity indicate that stimulated emission takes place in these nanowires. The observed single or multiple sharp peaks (FIG. 41, curve b and inset) represent different lasing modes at wavelengths between 370 and 400 nm. It was observed that the lasing threshold is quite low compared with previously reported values for random lasing (~300 kW/cm$^2$) in disordered particles or thin films. Significantly, these short-wavelength nanowire nanolasers operate at room temperature and the areal density of these nanolasers readily reaches $1.1 \times 10^{10}$ cm$^{-2}$.

Figure 43:
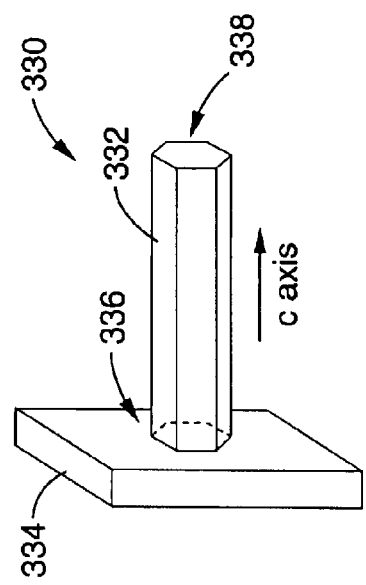
FIG. 43 is a schematic view of a ZnO nanowire on sapphire as a resonance cavity according to the present invention with two naturally faceted hexagonal faces acting as reflecting mirrors.

The fact that we observed lasing action in these nanowire arrays without any fabricated mirror prompts us to consider these single-crystalline, well-facetted nanowires act as natural resonance cavities to amplify stimulated emission. FIG. 43 schematically illustrates a nanolaser 330 fabricated using a multi-faceted (in this example, hexagonal) ZnO nanowire 332 grown on a sapphire substrate 334. Note that nanowire 332 is not a heterostructure but a homostructure in this application, however, it should be appreciated that the present invention is capable of heterostructure lasing as well as homostructure lasing. The nanowire acts as a resonant cavity with two naturally faceted hexagonal end faces 336, 338 acting as reflecting mirrors. It is possible that the giant oscillator strength effect, that can occur in high quality nanowire crystals with dimensions larger than the exciton Bohr radius, but smaller than the optical wavelength, enables the excitonic stimulated emission in these nanowire arrays. For II–VI semiconductors, a cleaved edge of the specimen is usually used as a mirror. For our nanowires, one end is the epitaxial interface 336 between the sapphire substrate 334 and ZnO while the other end is the sharp (0001) plane 338 of the ZnO nanocrystals. Both can serve as good laser cavity mirrors considering the refractive indexes for sapphire, ZnO and air are 1.8, 2.45 and 1.0, respectively. Note this is an important characteristic of this nanowire; namely, that it can be abutted against a waveguide very easily. This natural cavity/waveguide formation in nanowires suggests a simple chemical approach to form a nanowire laser cavity without cleavage and etching. In fact, when multiple lasing modes were observed for these nanowires (FIG. 41 inset), the observed mode spacing is about 5 nm for ~5 μm long wires, which agrees quantitatively well with the calculated spacing between adjacent resonance frequencies $v_F=c/2nl$, where $V_F$ is emission mode spacing, c the light speed, n the refractive index and/the resonance cavity length. Note also that an alternative manner in which a waveguide could be formed would be to coat the nanowire with a layer of polymer.

A laser according to the present invention can have nanowires supported in a solid polymer or glassy matrix, in solution, or extending off of the surface of a substrate. For wires attached to a substrate, the wires can either be disordered, or arranged so that they all point in the same direction. That direction can be normal to the substrate surface, or can be selected to be any other angle off of the substrate. In addition, even nanowires in a matrix material can be aligned so that they form an ordered structure. Note that the present invention includes lasers with the above-described nanowire-composite orientations, as well as non-laser heterostructures in the same configurations.

Figure 44:
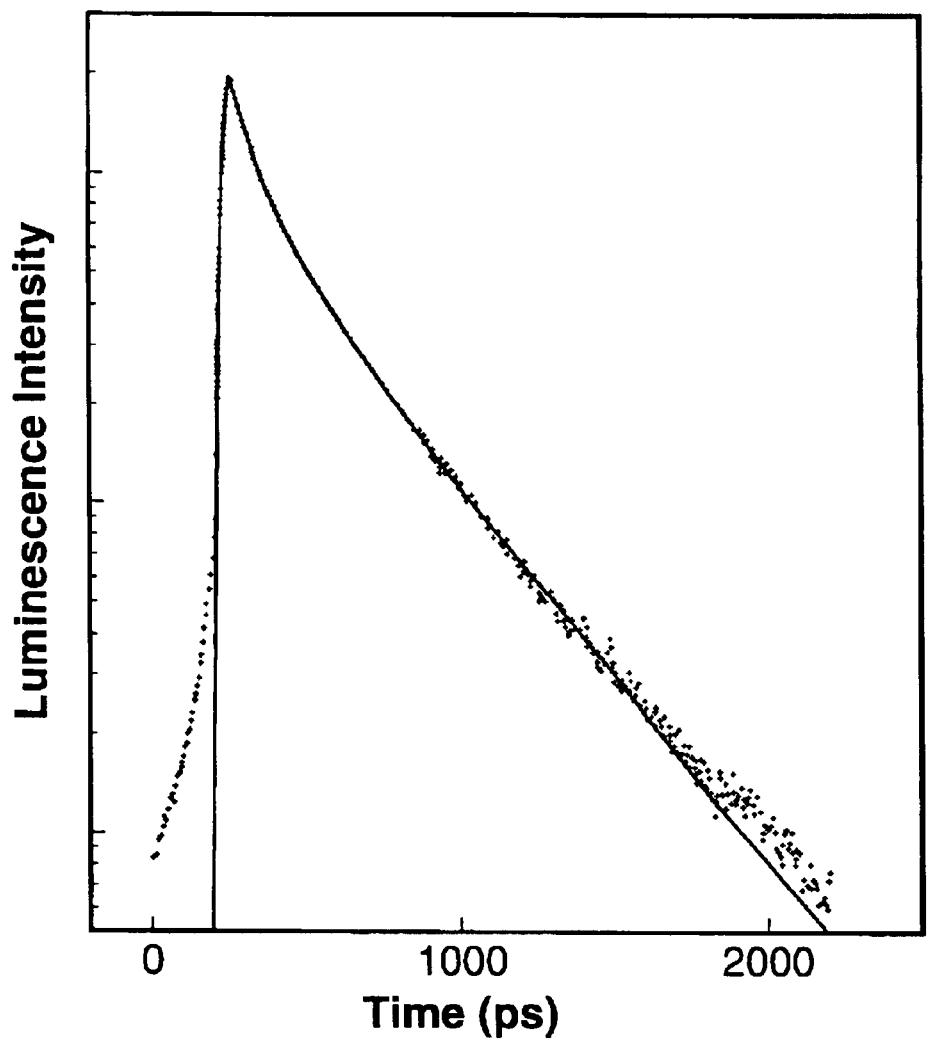
FIG. 44 is a graph showing the decay of the luminescence from a ZnO nanowire on sapphire according to the present invention using a frequency-tripled mode-locked Ti:sapphire laser for pulsed excitation and a streak camera with ps-resolution for detection.

The decay of the luminescence from the ZnO nanowires was studied using a frequency-tripled mode-locked Ti: sapphire laser for pulsed excitation (200 fs pulse length) and a streak camera with ps-resolution for detection. Referring to FIG. 44, a good fit (straight line) to the experimental data (dotted line) recorded at room temperature was obtained with a biexponential decay model assuming a fast and a slow process with time constants of about 70 ps and 350 ps, respectively. The time-resolved spectrum was recorded at excitation power of 6.39 mW. Therefore, these lifetime measurements show that the radiative recombination of the excitons is a superposition of a fast and a slow process. The luminescence lifetime is mainly determined by the concentration of defects, which trap the electrons and/or holes and eventually cause their nonradiative recombination. Although the exact origin of the luminescence decay remains unclear at this stage, the very long lifetime measured for these wires demonstrates the high crystal quality achieved with the nanowire growth process. Meantime, it also accounts in part for the low laser threshold reported here.

In summary, we have demonstrated room-temperature ultraviolet lasing in well-oriented vertical ZnO nanowire arrays with a lasing threshold of 40 kW/cm$^2$. The areal density of these nanolasers on substrate can readily reach $1.1 \times 10^{10}$ cm $10^{-2}$. We anticipate that the lasing wavelength can be tuned into blue region by making alloy nanowires of ZnO/CdO. In addition, by creating pn junctions in these individual nanowires, one should be able to test the possibility of mating electron ejection blue lasers from individual nanowires. Such miniaturized nanowire nano-lasers will find applications in nano-photonics and microanalysis.

From the foregoing it will be appreciated that nanowires according to the present invention can be used as optical cavities. Another way to create an optical cavity would be to create dielectrics on the ends of the wires. Additionally, some portions of the nanowire could have one energy transfer event and others have a different energy transfer event such as in a distributed feedback laser. It will also be appreciated that by capping off the ends of the optical cavity, either a laser or a light amplifier can be realized. Additionally, the cavity can be a part of the nanowire itself as previously described, the cavity could be external to the nanowire. In essence, a laser or light amplifier can be formed from a nanowire, a pumping source, and a cavity, wherein the cavity is part of the nanowire or separate from the nanowire. Furthermore, by using conventional stimulated emission techniques, a cavity is not required.

It will also be appreciated that nanowires according to the present invention could be employed as a functional component of a quantum dot laser such as described in U.S. Pat. No. 5,260,957 incorporated herein by reference, wherein the quantum dots would be integrated into the nanowire as described herein and the pumping source would be configured for exciting a population inversion in the quantum dots. Note, however, that a nanowire itself can be pumped for lasing where the pumping promotes a population inversion in the nanowire. The nanowire can be embedded in a polymer matrix as previously described, and can function as an element in a matrix of such lasing devices. The pumping source can be an optical pumping source, such as a pumping laser, or an electrical pumping source having an anode and cathode which contact the nanowire either directly or through ohmic contacts. If a pumping laser is employed, the wavelength of the pump would preferably be higher than the nanowire by greater than approximately 10 meV, and more preferably greater than 100 meV. The nanowire can be placed in a cavity or the ends can be formed with reflective faces so that the nanowire functions as a cavity.

6.6 Additional Devices.

From the foregoing, it will be appreciated that a number of devices can be fabricated using nanowires and the synthesis methods described above. Additional specific devices include, but are not limited to, the following.

6.6.1 Field-effect Transistor (FET).

This is a three terminal device that can be realized using COHNs. The current flowing from the "source" to the "drain" is controlled by the voltage at the "gate". The source and drain can be at any two points along the nanowire that contact the nanowire core. The gate contact is applied to the nanowire sheath at some point between the source and drain. The gate voltage controls the conductivity of the channel between the source and drain. At least two types of FETs can be fabricated in this manner. First, a junction FET is fabricated with a reverse bias pn junction at the gate. In this case the nanowire core is an n-type semiconductor and the sheath is p-type (or vice versa). Applying a reverse bias at the junction can increase the depletion region inside the core and thus inhibit current flow from the source to drain. The second kind of FET is based on metal-oxide (MOSFET) or metal-insulator (MISFET) contact at the gate. In this case the nanowire sheath is made of two sub-sheaths. The nanowire core is first covered with a layer of oxide or insulator and then with a conducting layer. Applying a voltage between the conducting sheath and the nanowire core can remove the channel between source and drain (depletion-mode MOSFET or MISFET) or create a channel (enhancement-mode MOSFET or MISFET) if the nanowire core did not have a conducting channel between the source and drain at zero gate voltage. Additionally, a three-terminal device such as, but not limited to, those depicted in FIG. 34 and FIG. 35 could be utilized with two terminals acting as source and drain and the third acting as a gate. In particular, it is possible to create a MOSFET structure in a three-terminal device in which an insulating heterojunction is placed between the source-drain path and the gate-electrode.

6.6.2 Infrared Detector.

An infrared (IR) detector can be made using nanowires made of semiconducting material having a bandgap within the infrared wavelengths (1–20 microns). The detector is preferably a two terminal device, with two connections at the two ends of the nanowire. Presence of light changes the conductivity of the nanowire, which is measured using an applied bias between the two terminals (photoconductor); or the light creates a voltage across the nanowire with no external biasing circuit (photovoltaic operation). Photovoltaic operation requires an internal electric field in the nanowire. This can be realized using p-n junction along the nanowire or metal/semiconductor junction at the contacts to the two extremes of nanowire. When the nanowire diameter is smaller than the electron deBroglie wavelength of electrons, quantum confinement effect will change the effective bandgap of material and the region of sensitivity to IR radiation. A second type of IR detector can be fabricated using LOHNs. Similar to quantum well infrared intersubband photodetectors, a series of heterostructures along the direction of nanowire create quantized electronic states inside conduction band or valence band of the material. Optical absorption between these electronic states can be tailored to be at any IR wavelength (1–20 microns), not limited by the bandgap of the material. Again contacts at the two ends of nanowire will allow realization of a photoconductive or photovoltaic IR detector.

6.6.3 Single Electron Infrared Detector.

This device is similar to the previous LOHN-based infrared detector. The only difference is that the heterostructure layer parameters (length, nanowire diameter, composition) are chosen so that creation of a free electron inside that particular layer changes the electrostatic energy by an amount so that no other electrons can be transported across this layer until the free electron leaves (coulomb blockade). This enables detecting single electron (and thus single photon) events.

6.6.4 Resonant Tunneling Diode.

This is a two terminal device made of LOHNs. The basic idea is that a LOHN is divided into five segments (emitter, barrier 1, well, barrier 2, collector). The well layer is short enough so that electronic energy states are quantized. The band structure of the barrier layer is chosen so that electron wavefunction is evanescent but the electron transmission probability across the layer is non-zero. Under a bias, electrons are emitted from the emitter contact to the collector contact. At a specific bias, so that the energy of incident electrons from emitter corresponds to the quantized energy levels in the well, transmission across the whole structure is enhanced (resonant tunneling) which gives rise to negative differential resistance in the device current-voltage characteristics, and can be utilized by way of example, to make high speed oscillators or logic circuits.

6.6.5 Light Emitting Diode.

A single nanowire light emitting diode can be made of pn junction along the nanowire. A heterostructure near the depletion region (where electrons and holes recombine), can be used to make more efficient LEDs by confining the carriers. In order to make LEDs with an array of nanowires, it is important to incorporate an appropriate filling (polymer, etc.) with low absorption and scattering losses. The final device will be composed of two electrodes with nanowire composite in between.

6.6.6 Electrically Pumped Laser.

This is made of nanowire composite LEDs plus an optical cavity. The optical cavity can be made of dielectric mirrors in vertical configuration (along with contacts to the two sides of the nanowire composite material) or in a horizontal configuration (similar to distributed Bragg reflector lasers).

6.6.7 Optical Waveguide/Interconnect.

In this configuration, nanowires are used either as a part of composite material (nanowire plus filling material) or light is guided inside the nanowire itself. In the latter case the main parameters in the design are the optical loss along the wire and the number of lateral modes. Typical design is based on COHNs, where the indices of the core and sheath layers are chosen to achieve a specific number of guided modes or group dispersion values (this is similar to the design of silica-based optical fibers). For the former case (nanowire composite material), it can be treated as a new engineered material and conventional methods to fabricate waveguides (ridge type, slab layer, etc.) can be used.

6.6.8 Optical Coupler/Modulators/Switch.

In the case of nanowire composite materials, basically we will have a filling material (e.g. a polymer) whose electro optical, thermo optical or magneto optical properties are modified by the incorporation of nanowire arrays. One can choose different materials and various wire diameters to tune the required properties (increase electro-optic coefficient, incorporate optical gain with nanowire pn junctions, etc.). Once the nanowire composite material is fabricated, it can be treated as a novel thin film material and conventional techniques to realize waveguide switches, modulators, couplers, etc. can be used. The main advantage is that the rich properties of passive and active heterostructure nanowires is combined with simple processing of polymer based thin film devices.

6.6.9 Electromechanical/Thermomechanical Devices.

Nanowires made of piezoelectric or piezoresistive materials could be used as electromechanical sensors. Under uniaxial strain, in the direction along the wire (longitudinal), a piezoelectric (e.g., AlN, ZnO) nanowire can produce a voltage signal, whereas a piezoresistive nanowire (e.g., Si) will produce a change in resistance, which can be measured by passing a current. When these are formed into a polymer matrix composite one can essentially get a flexible/conformal material that can be used to detect uniaxial strain. The piezoelectric device can be used to generate uniaxial motion as well. If nanowire heterostructures are formed in a way that a single crystal nanowire is coated on one side with another material (e.g., a partial COHN as described herein), then it could be used to generate bending motion as a bimorph. For example, if the two materials have different thermal expansion coefficients, they could be used for detecting temperature and anything that changes temperature (radiation absorption, electrical dissipation, and for forth). In addition, by changing the temperature this device could be used for thermal actuation. A nanowire-based bimorph can also be used to detect any strain perpendicular to the direction of the nanowire axis.

6.6.10 Chemical Sensing Devices.

While nanowires can behave as chemical sensors, they can also be used for chemical logic. For example, consider a LOHN, which has segments of materials A, B, C. Supposing that material A becomes conductive when it adsorbs chemical A', while similarly B becomes conductive when it adsorbs material B'. Now only in the presence of chemicals A', B' and C', will high conductivity exist in the nanowire. This is a sort of chemical logic, i.e. A' and B' and C'=1 such that A' and B' and not C'=0 etc. If you put these structures in series/parallel networks, you could then generate AND and OR logic. One could of course extend this to biological sensing. In fact, it will be much easier for biological sensing, since bio-receptors are highly specific.

7. Conclusion.

From the foregoing discussion it can be seen that when semiconductors are confined to 2, 1 or 0 dimensional structures in the size range of less than approximately 200 nm, and preferably in the range of approximately 5 nm to 50 nm, their properties can be manipulated in novel ways. The methods described herein along with other chemical synthesis techniques can be used to grow nanowires and associated heterostructures. These structures include coaxial heterostructure nanowires (COHNs) and longitudinal heterostructure nanowires (LOHNs) and combinations thereof. COHNs allow modulation doping such that nanowires with extremely high charge carrier mobility can be obtained, while LOHNs allow bandgap engineering in 1-D, which can lead to multiple quantum dots or pn junctions integrated within a single nanowire. Engineering the band structure near the Fermi level will also allow tailoring of their thermoelectric properties. 1-D confinement has a strong influence on phonon spectra and lifetimes, which could dramatically change their thermal properties. In addition, nanowire heterostructures offer the promising prospects of integrating piezoelectric nanostructures with semiconducting nanowires, resulting in nanoelectromechanical transducers. Also, the elastic boundary conditions in COHNs and LOHNs enable dislocation-free interlaces that are not stable in 2-D (quantum wells and heterostructures) or thin film form, while also providing access to new stable phases that are metastable in bulk or thin film forms.

COHNs and LOHNs also lend themselves to the development of energy conversion devices, including thermoelectric refrigerators or power generators, light emitting devices, and nanoelectromechanical transducers. The active material in these devices comprises composites made of nanowire arrays preferably embedded in a polymer matrix, such that they can be patterned and integrated into microsystems. Semiconducting nanowires with diameters in the 5 nm to 10 nm range provide the unique opportunity to develop thermoelectric refrigerators and power generators with performances comparable to or better than those based on gas or vapor. Such solid-state devices could have enormous impact on energy utilization technology as well as on the environment. Use of nanowires containing integrated quantum dots can all efficient and size-tunable optoelectronic conversion.

Furthermore, embedding such nanowires in a polymer matrix will produce a light emitting flexible medium with much lower effective index than semiconductors, which will enable efficient coupling with optical fibers and thereby dramatically improve external quantum efficiencies. When combined with single electronics, such quantum dot nanowires offer the possibility of single photonic devices that can significantly impact information storage and processing. Nanowire-based piezoelectric transducers will lead to high quality factor and high resonant frequency devices that can be used for applications ranging from molecular sensing and nano-actuators to high-frequency signal processors. Finally, single-crystalline nanowires with naturally faceted end faces functioning as mirrors can be used for nanolaser devices.

LOHNs containing heterostructures along the nanowire, length can also be designed to have very interesting properties, including, but not limited to: (a) pn or pnp or various other junctions that could be used for photonic devices, (b) multiple quantum dots with size-tunable optical absorption/emission and single electron tunneling properties, thus leading to single photonic devices; (c) nanowire superlattices with high electron mobility and reduced phonon transport, and thereby useful for thermoelectric devices; and (d) piezoelectric and electronic heterodevices for nanoelectromechanical transduction. Note also that the elastic boundary conditions of nanowire heteroepitaxial growth offer the possibility to create dislocation free interfaces in the superlattice nanowires that are not stable in the conventional 2-D configuration achieved by epitaxial film growth on planar substrates. On the other hand, there are cases where dislocations are desirable as well, and the present invention allows for defect control.

Although much effort in the past has been focused on synthesizing and studying zero-dimensional (0-D) (quantum dots) and 2-D (quantum wells and heterostructures) nanostructures, semiconducting nanowires other than carbon nanotubes have received relatively little attention. Note, however, that compared to quantum dots, nanowires that are approximately 1 $\mu$m to approximately 10 $\mu$m long provide the unique opportunity of integrating nanostructures with photolithographically microfabricated features that are generally $\approx 1$ $\mu$m. In addition, nanowires also allow further confinement over 2-D structures that have been extensively studied and utilized in the past. Because of these favorable attributes, various other types of devices based on nanowire heterostructures can be designed and fabricated as well, including, but not limited to: (i) high efficiency thermoelectric refrigerators or power generators; (ii) tunable light emitting diodes; (iii) piezoelectric nanomechanical sensors and actuators. The use of nanowire heterostructures in these devices is critical, since they would either dramatically improve conversion efficiencies or open up new ways of conversion, as discussed in detail later. These simple devices also form the foundation for more sophisticated devices.

It will be appreciated that various configurations can be achieved using the foregoing inventive structures, some of which have been previously described. By way of further example, and not of limitation, these configurations can include single and multiple junction LOHNs, single and multiple junction COHNs, combinations of LOHN and COHN structures, two-terminal configurations, N>2 terminal configurations, combinations of heterostructures and homostructures, homostructures with one or more electrodes (which would also be an overall heterostructure), heterostructures with one or more electrodes, homostructures with insulators, heterostructures with insulators, and the like. It will also be appreciated that the interface between a nanowire and a terminal constitutes a heterojunction. A variety of devices can be fabricated using these structures and configurations, including, but not limited to, phonon bandgap devices, quantum dots that confine electrons in specific areas, thermoelectric devices (e.g., solid state refrigerators and engines), photonic devices (e.g., nanolasers), nanoelectromechanical (MEM) devices (electromechanical actuators and sensors), energy conversion devices of various forms including for example, light to mechanical energy or thermal energy to light, and other devices.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A nanowire, comprising:

a first segment of a first material; and a second segment of a second material joined to said first segment;

wherein at least one of said segments has a substantially uniform diameter of less than approximately 200 nm; and wherein said nanowire is selected from a population of nanowires having a substantially monodisperse distribution of diameters.

2. A nanowire, comprising:

a first segment of a first material; and a second segment of a second material joined to said first segment;

wherein at least one of said segments has a substantially uniform diameter;

said nanowire displaying characteristics selected from the group consisting essentially of electronic properties, optical properties, physical properties, magnetic properties and chemical properties that are modified relative to the bulk characteristics of said first and second materials by quantum confinement effects.

3. A nanowire, comprising:

a first segment of a first material; and a second segment of a second material joined to said first segment;

wherein at least one of said segments has a substantially uniform diameter;

said nanowire having at least one electronic property that varies as a function of diameter of said nanowire.

4. A nanowire as recited in claim 3, wherein said at least one electronic property of said nanowire comprises bandgap energy which varies as a function of diameter of said nanowire.

5. A nanowire, comprising:

a first segment of a substantially crystalline material; and a second segment of a substantially crystalline material joined to said first segment;

wherein at least one of said segments has a substantially uniform diameter of less than approximately 200 nm.

6. A nanowire as recited in claim 5, wherein each of said first and said second segments comprises a doped semiconductor material.

7. A nanowire as recited in claim 6, wherein said doped semiconductor material is selected from the group consisting essentially of a group III–V semiconductor, an elemental semiconductor, a group II–VI semiconductor, a group II–IV semiconductor, and tertiaries and quaternaries thereof.

8. A nanowire as recited in claim 5, wherein each of said first and second segments exhibits the electrical characteristics of a homogeneously doped semiconductor.

9. A nanowire superlattice structure, comprising:

a first segment of a material;

a second segment of a material joined to said first segment; and a third segment of a material joined to at least one of said first or second segments;

wherein at least two of said segments are longitudinally adjacent;

wherein at least two of said segments comprise compositionally different materials; and wherein at least one of said segments has a substantially uniform diameter of less than approximately 200 nm.

10. A nanowire superlattice structure, comprising:

a first segment of a material;

a second segment of a material joined to said first segment; and a third segment joined to at least one of said first or second segments;

wherein at least two of said segments comprise compositionally different materials; and wherein at least two of said segments are longitudinally adjacent;

said nanowire superlattice structure displaying characteristics selected from the group consisting essentially of electronic properties, optical properties, physical properties, magnetic properties and chemical properties that are modified relative to the bulk characteristics of said first and second materials by quantum confinement effects.

11. A nanowire supertattice structure, comprising:

a first segment of a material;

a second segment of a material joined to said first segment; and a third segment joined to at least one of said first or second segments;

wherein at least two of said segments comprise compositionally different materials; and wherein at least two of said segments are longitudinally adjacent;

said nanowire superlattice structure having at least one electronic property that varies as a function of diameter of at least one of said segments.

12. A nanowire superlattice structure as recited in claim 11, wherein said at least one electronic property of said nanowire supper lattice comprises band gap energy which varies as a function of diameter of said nanowire.

13. A nanowire superlattice structure, comprising:

a first segment of a substantially crystalline material;

a second segment at a substantially crystalline material joined to said first segment; and a third segment of a substantially crystalline material joined to at least one of said first or second segments;

wherein at least two of said segments comprise compositionally different materials;

wherein at least two of said segments are longitudinally adjacent; and wherein at least one of said segments has a substantially uniform diameter of less than approximately 200 nm.

14. A nanowire superlattice structure as recited in claim 9, 10, 11, 12, or 13 wherein each of said segments comprises a doped semiconductor material.

15. A nanowire superlattice structure as recited in claim 14, wherein said doped semiconductor material is selected from the group consisting essentially of a group III–V semiconductor, an elemental semiconductor, a group II–VI semiconductor, a group II–IV semiconductor, and tertiaries and quaternaries thereof.

16. A nanowire superlattice structure as recited in claim 9, 10, 11, 12, or 13, wherein each of said segments exhibits the electrical characteristics of a homogeneously doped semiconductor.

17. A superlattice structure as recited in claim 9, 10, 11, 12, 13, 14, 15, or 16, wherein said first and second segments are longitudinally adjacent, wherein said third segment comprises a shell around a core, and wherein said core comprises said first or second segment.

18. A superlattice structure as recited in claim 9, 10, 11, 12, 13, 14, 15 or 16, wherein said first and second segments are longitudinally adjacent, wherein said third segment comprises a shell around a core, and wherein said core comprises said first and second segments.

19. A superlattice structure as recited in claim 9, 10, 11, 12, 13, 14, 15, or 16, wherein said first and second segments are longitudinally adjacent, wherein said first or second segment comprises a shell around a core, and wherein said core comprises said third segment.

20. A superlattice structure as recited in claim 9, 10, 11, 12, 13, 14, 15 or 16, wherein said first and second segments are longitudinally adjacent wherein said first and second segments comprise a shell around a core, and wherein said core comprises said third segment.

21. A superlattice structure as recited in claim 9, 10, 11, 12, 13, 14, 15 or 16, further comprising a fourth segment joined to at least one of said first or second segments, said fourth segment joined to said third segment, wherein said third and fourth segments comprise a shell around a core, and wherein said core comprises said first and second segments.

* * * * *